United States Patent
Solomon

(10) Patent No.: US 7,736,021 B2
(45) Date of Patent: Jun. 15, 2010

(54) BEAM OPTICS AND COLOR MODIFIER SYSTEM

(76) Inventor: Dennis J Solomon, P.O. Box 289, Yarmouth Port, MA (US) 02675-0289

( * ) Notice: Subject to any disclaimer, the term of this patent is extended or adjusted under 35 U.S.C. 154(b) by 642 days.

(21) Appl. No.: 11/335,435

(22) Filed: Jan. 19, 2006

(65) Prior Publication Data

US 2006/0126336 A1 Jun. 15, 2006

Related U.S. Application Data

(63) Continuation-in-part of application No. 10/941,461, filed on Sep. 15, 2004, now abandoned, and a continuation-in-part of application No. 09/793,811, filed on Feb. 24, 2001, now abandoned.

(60) Provisional application No. 60/645,656, filed on Jan. 19, 2005, provisional application No. 60/683,176, filed on May 20, 2005, provisional application No. 60/696,733, filed on Jul. 5, 2005.

(51) Int. Cl.
*F21S 8/00* (2006.01)

(52) U.S. Cl. .................. 362/277; 362/257; 362/269; 362/270; 362/271; 362/317

(58) Field of Classification Search ........... 362/257, 362/277, 317, 269–271; 359/227, 234, 236
See application file for complete search history.

(56) References Cited

U.S. PATENT DOCUMENTS

| 4,527,186 | A | * | 7/1985 | Acker | 396/429 |
| 6,062,710 | A | * | 5/2000 | Hewitt | 362/351 |
| 6,102,554 | A | * | 8/2000 | Wynne Willson et al. | 362/281 |
| 6,565,233 | B1 | * | 5/2003 | Richardson | 362/293 |

* cited by examiner

Primary Examiner—Sandra L O'Shea
Assistant Examiner—Meghan K Dunwiddie

(57) ABSTRACT

A high performance, efficiency compact optical light beam and modifier system with reduced artifacts is presented. The design may incorporate a spiral entrance aperture with corresponding spiral masks where modification is accomplished by rotating the masks about the central axis relative to the entrance aperture. Light recapture or complex, continuous optics may be employed to increase the optical efficiency, reduce the physical dimensions, integrate condensing, or image projection functions in a reduced number of optical components.

11 Claims, 45 Drawing Sheets

14',14'',14'''

14''',14'',14'

14

14R

70

(a)

(b)

(c)

(a)

(b)

(a) 14D (b) 14D (c) 14D (d) 14D
14D (a) 
14D (b) 
14D'

(a)

(b)

(c)

(a)

(b)

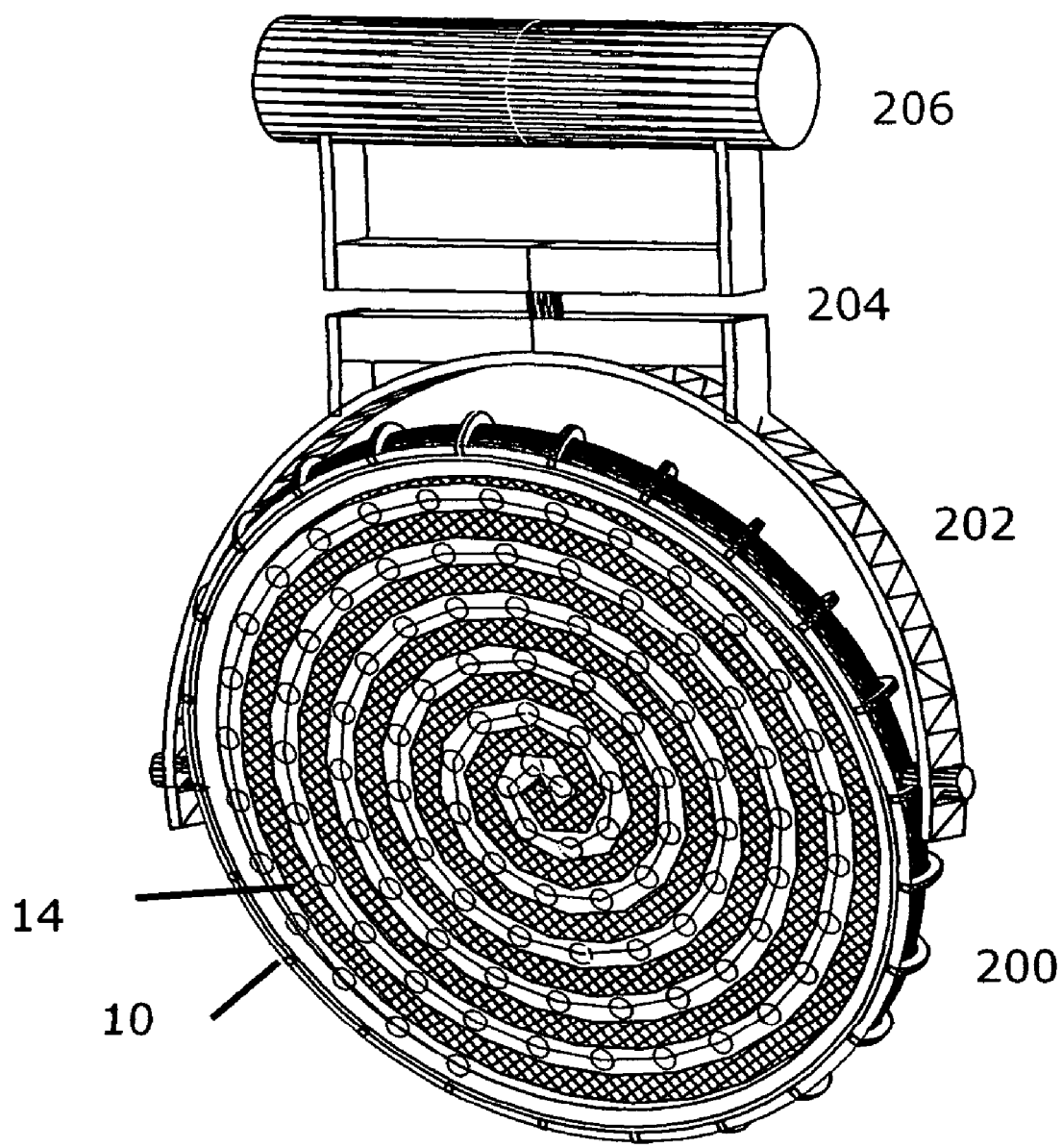
Fig II-1

Fig II-2
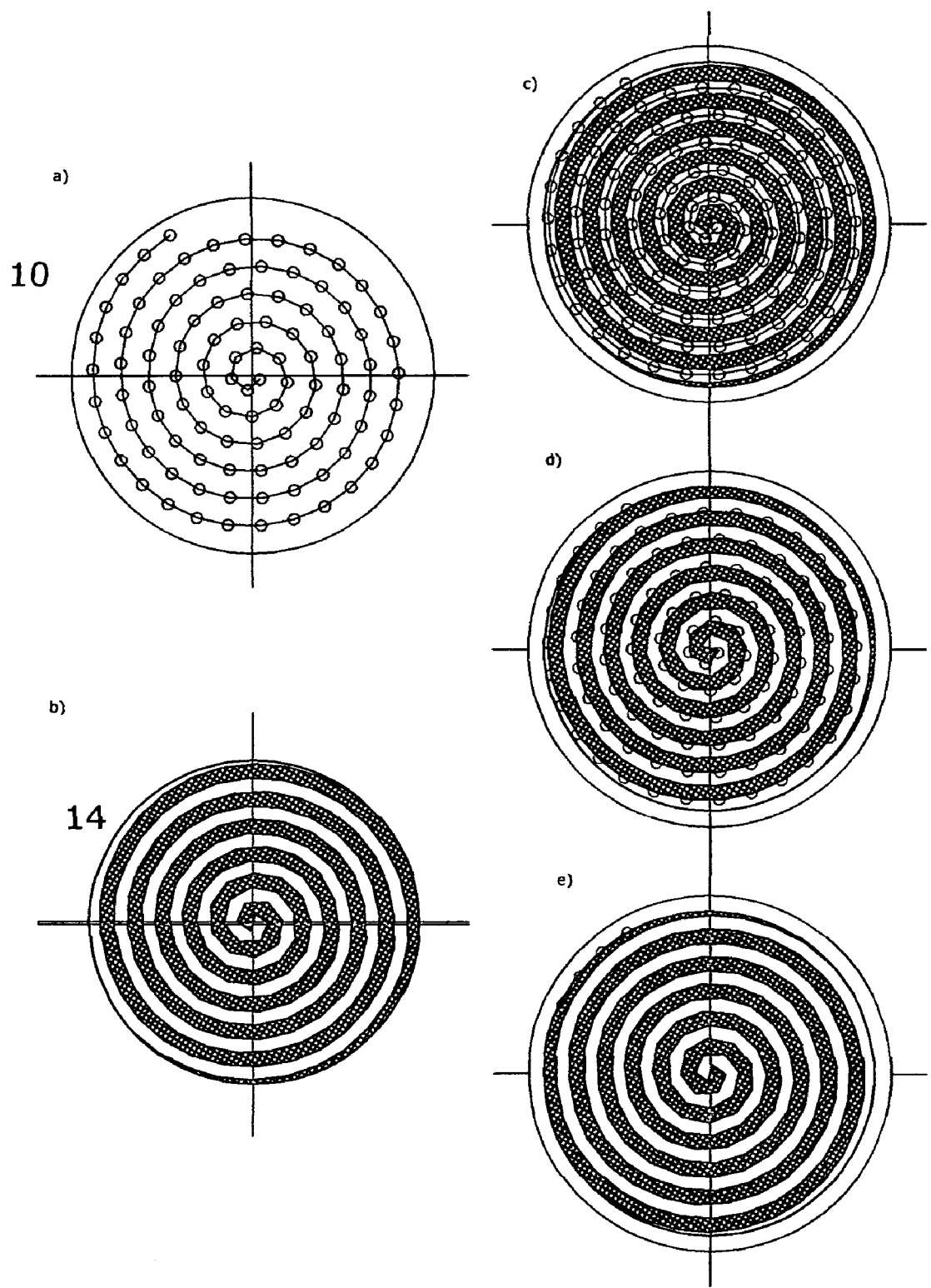

Fig II-3
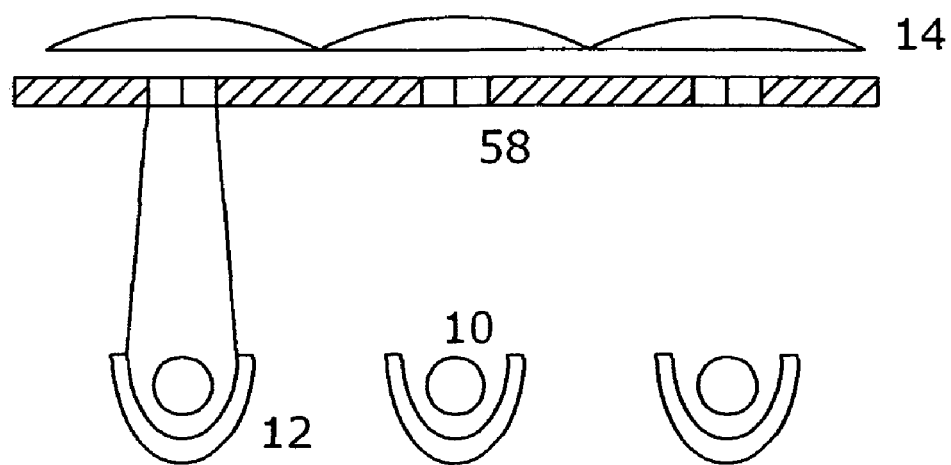
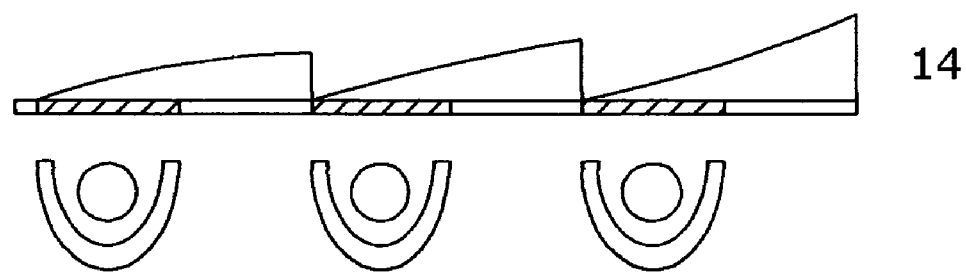

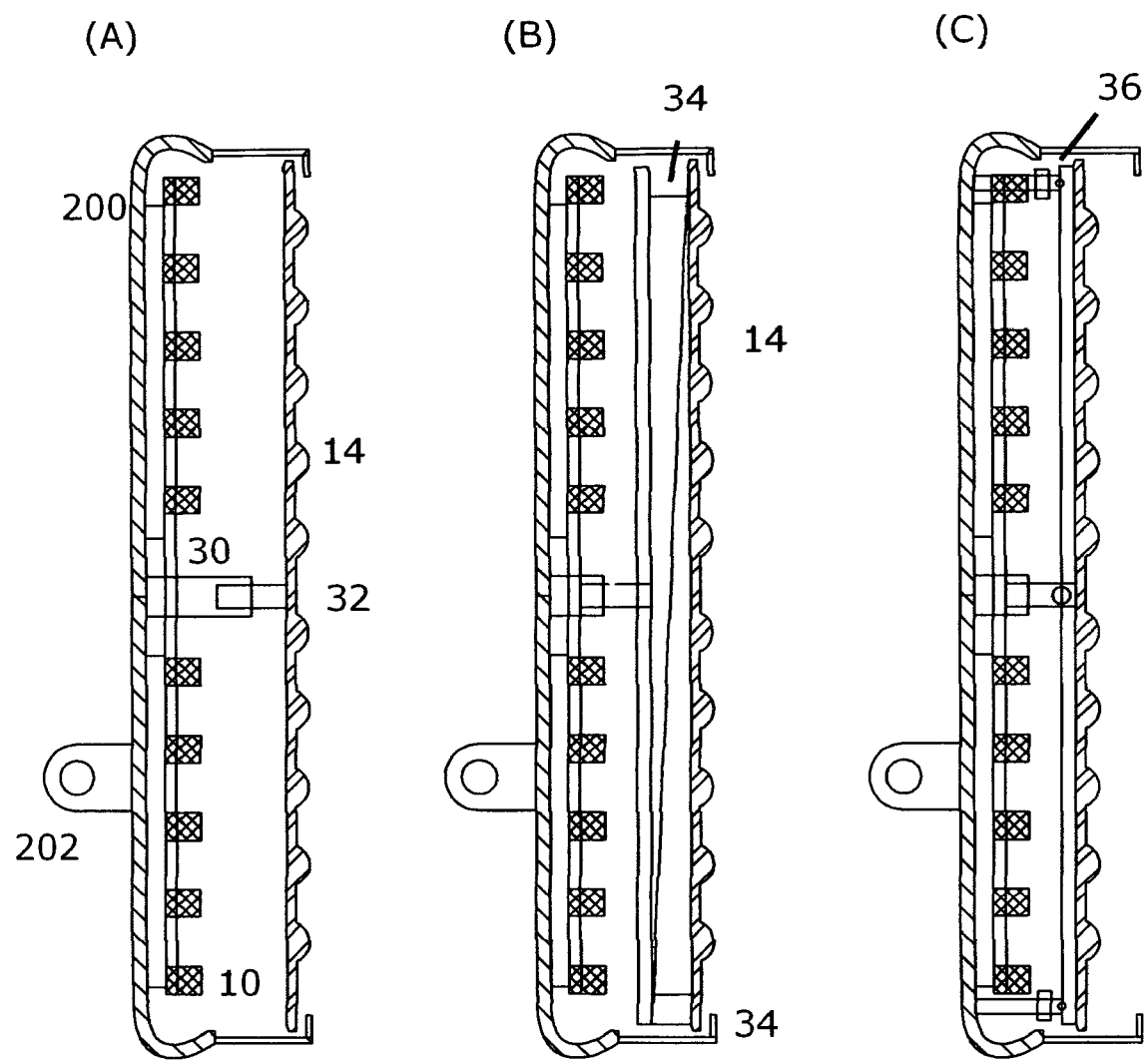
Fig II-4

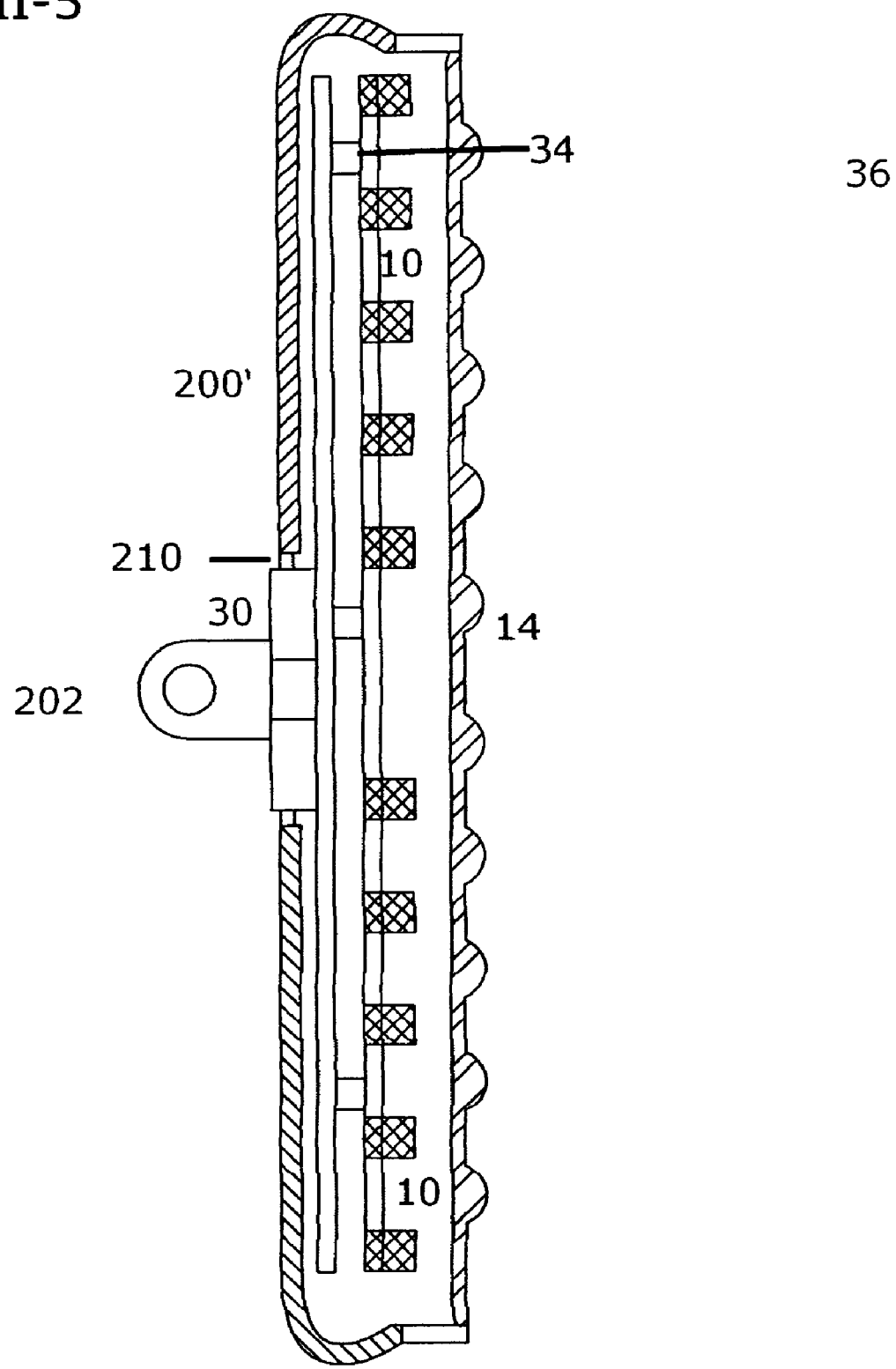
Fig II-5

Fig II-6
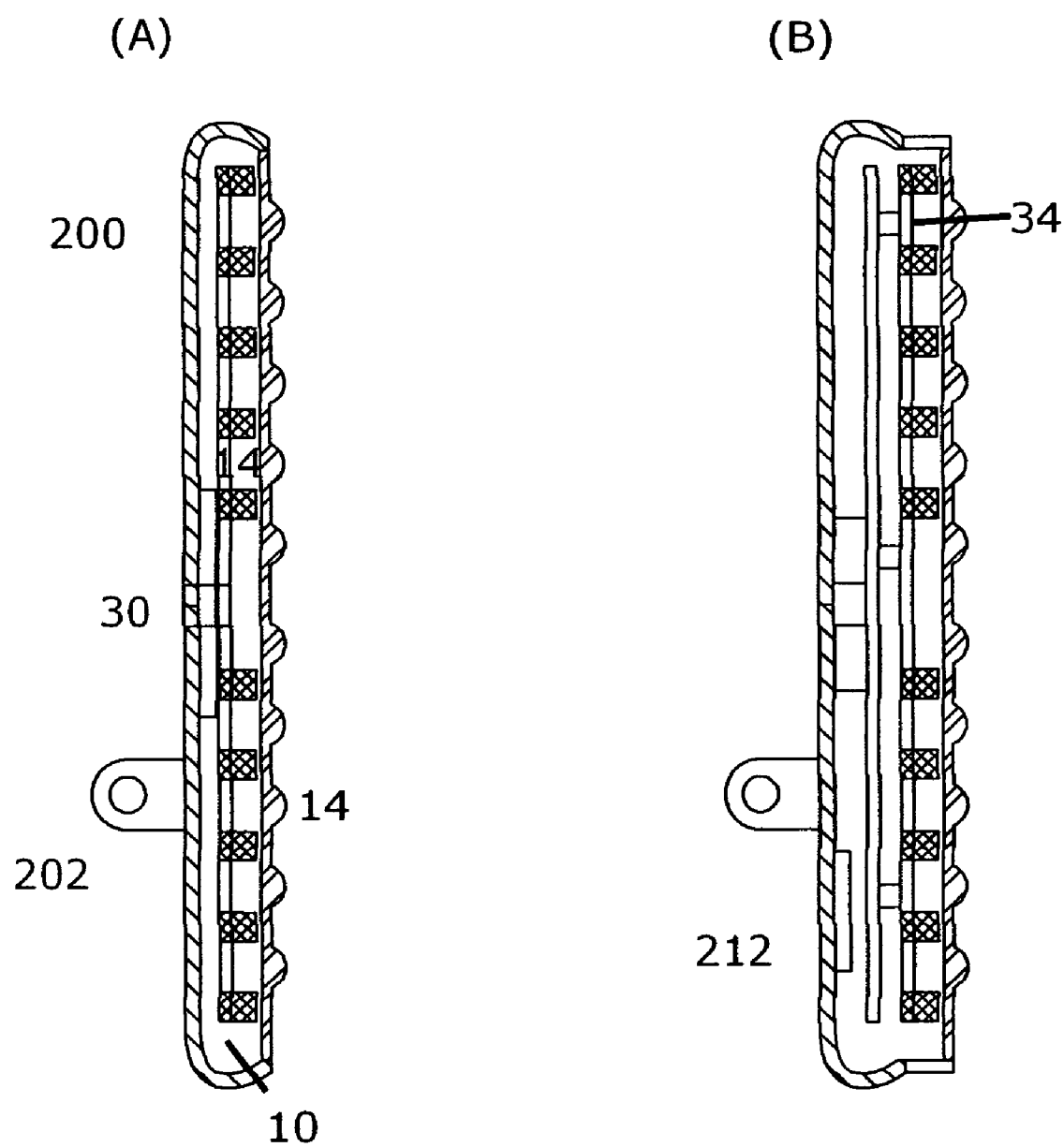

Fig II-7
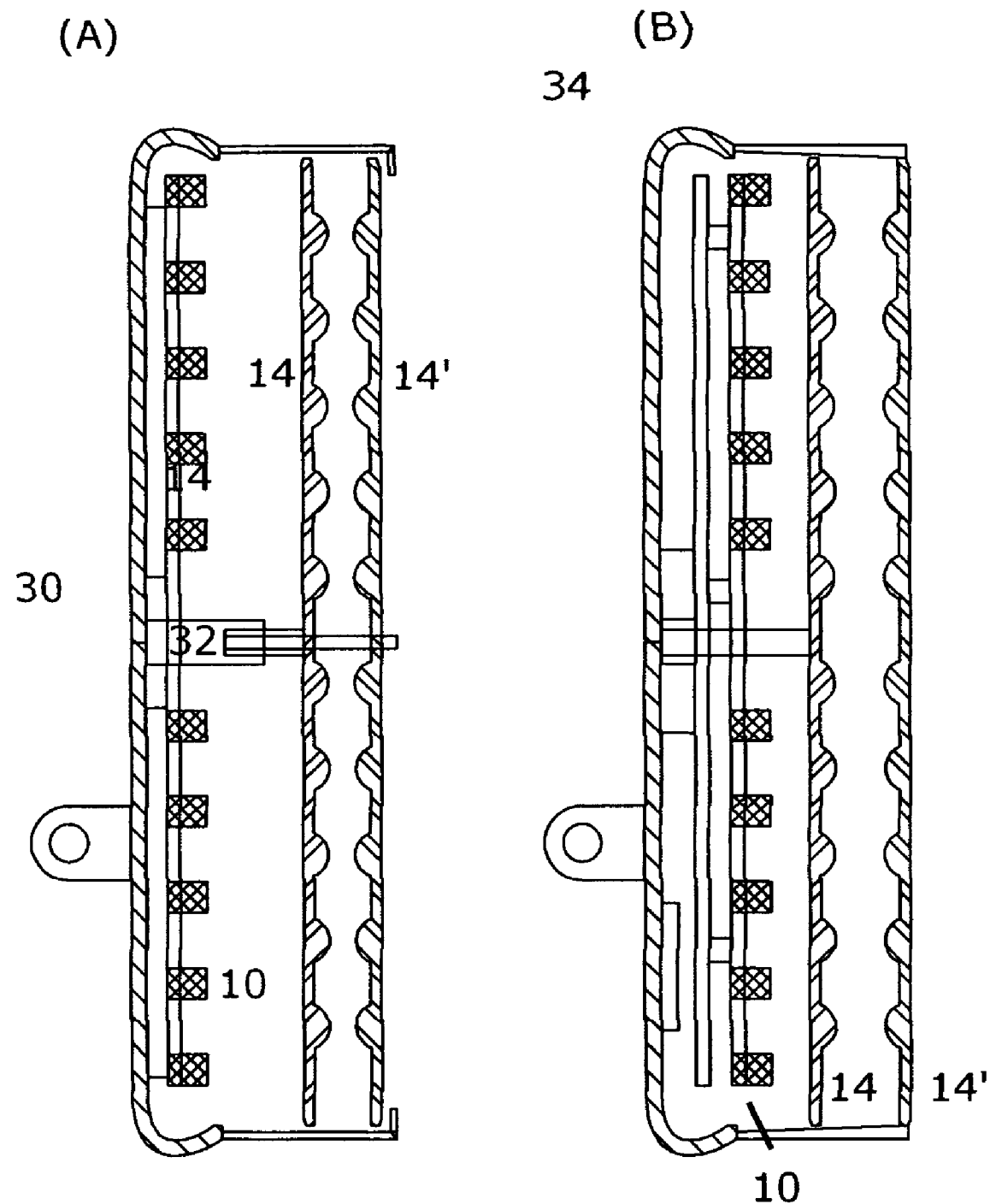

Fig. III-1
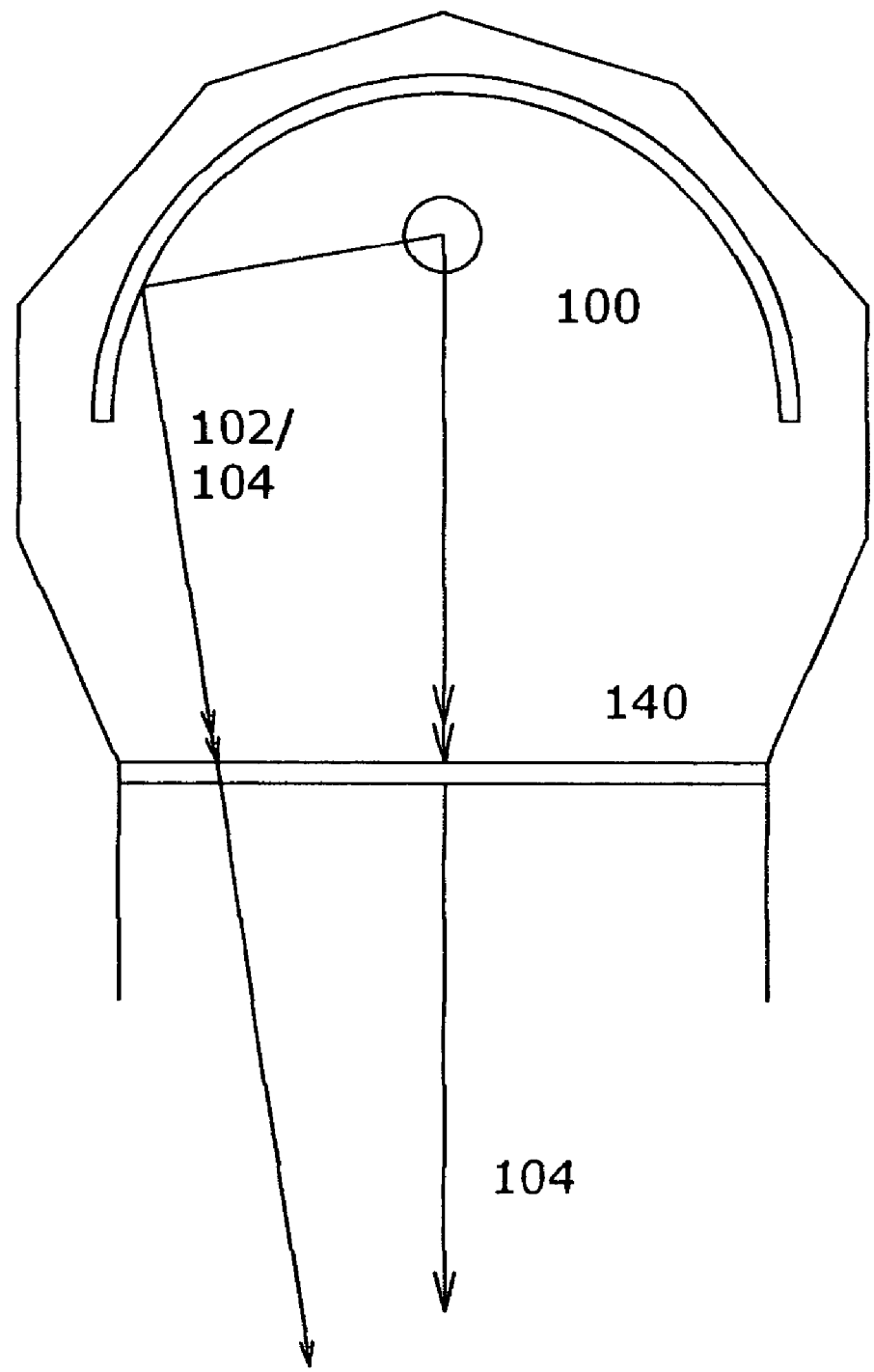

Fig. III-2
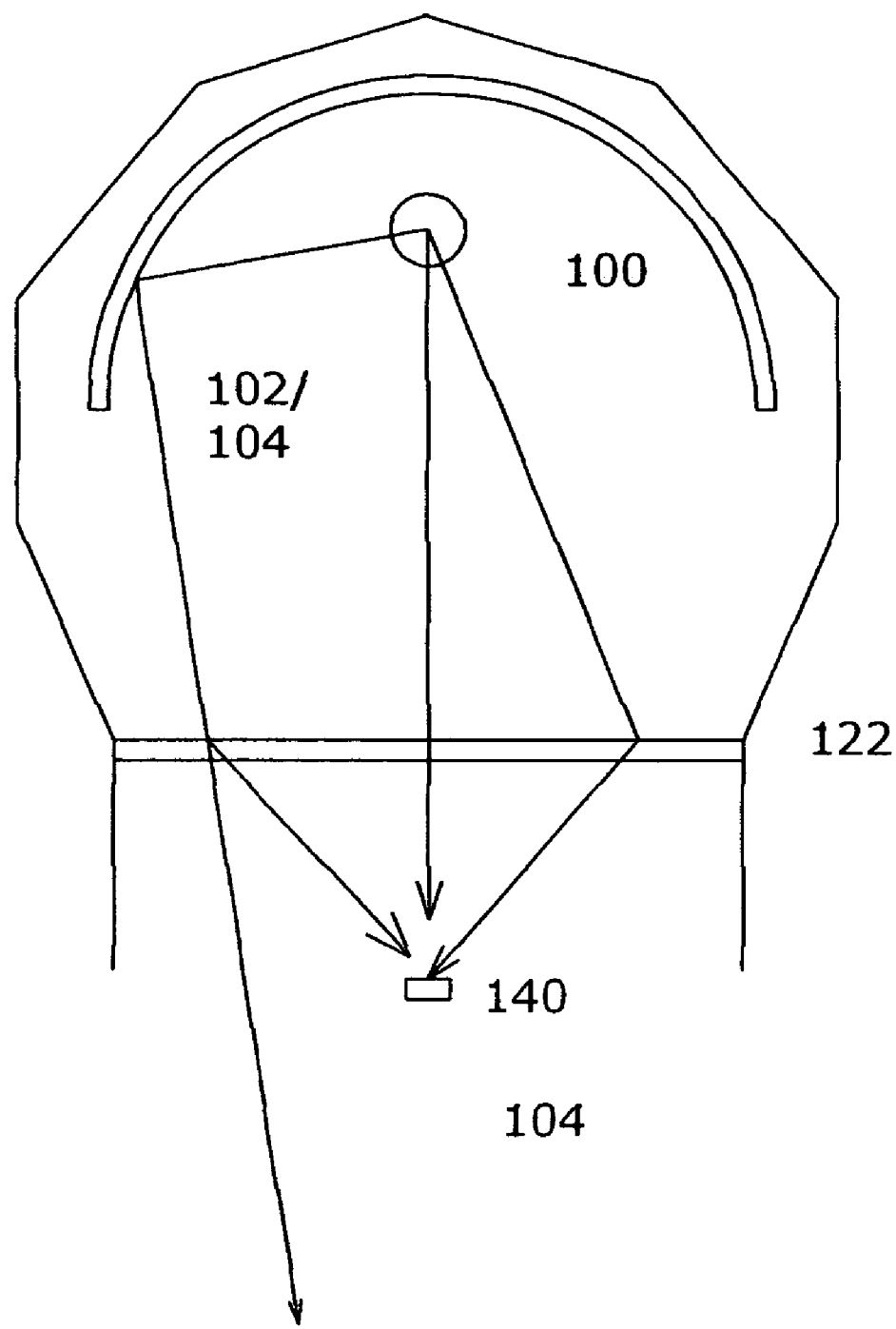

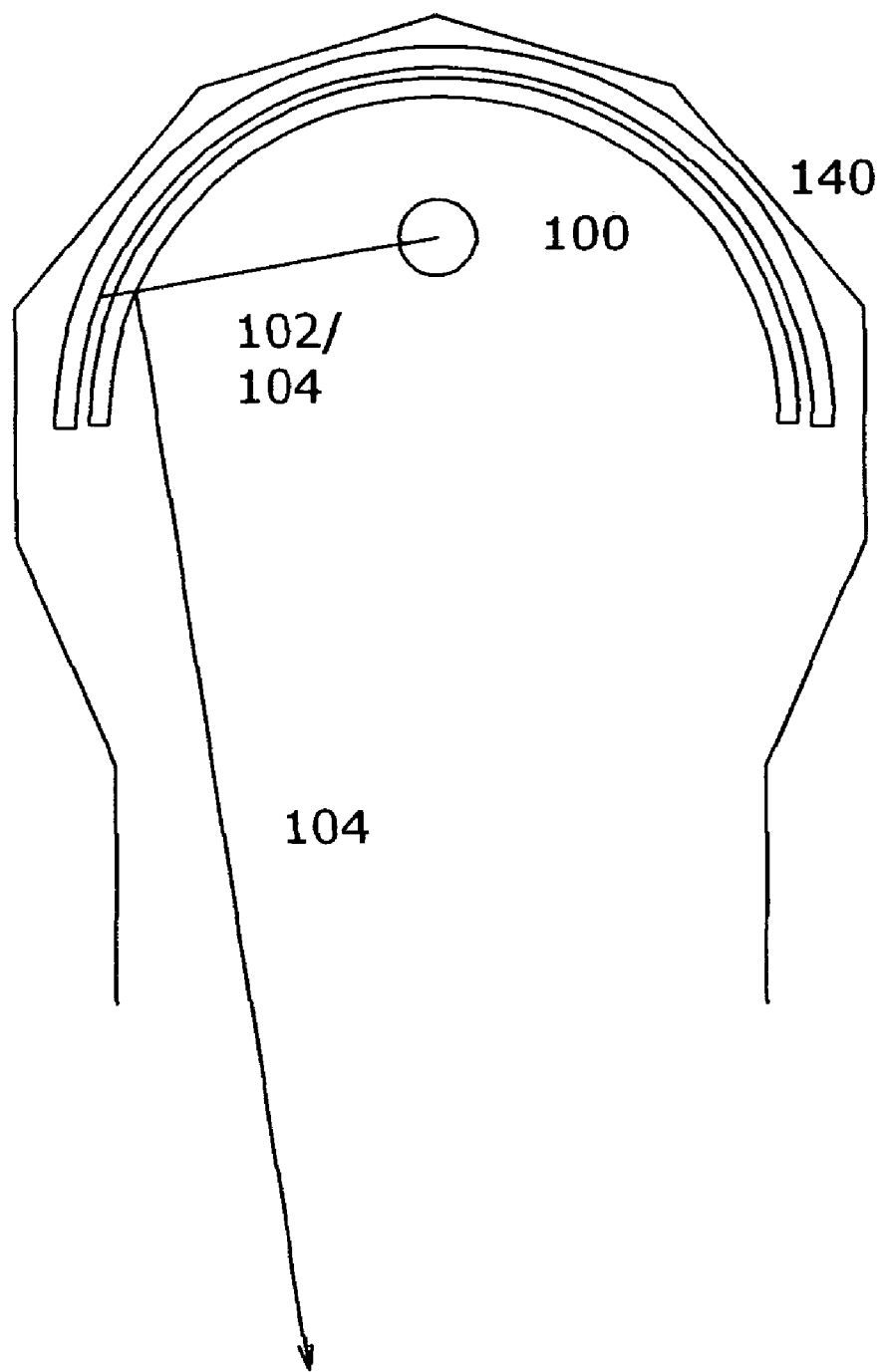
Fig. III-3

Fig. III-4
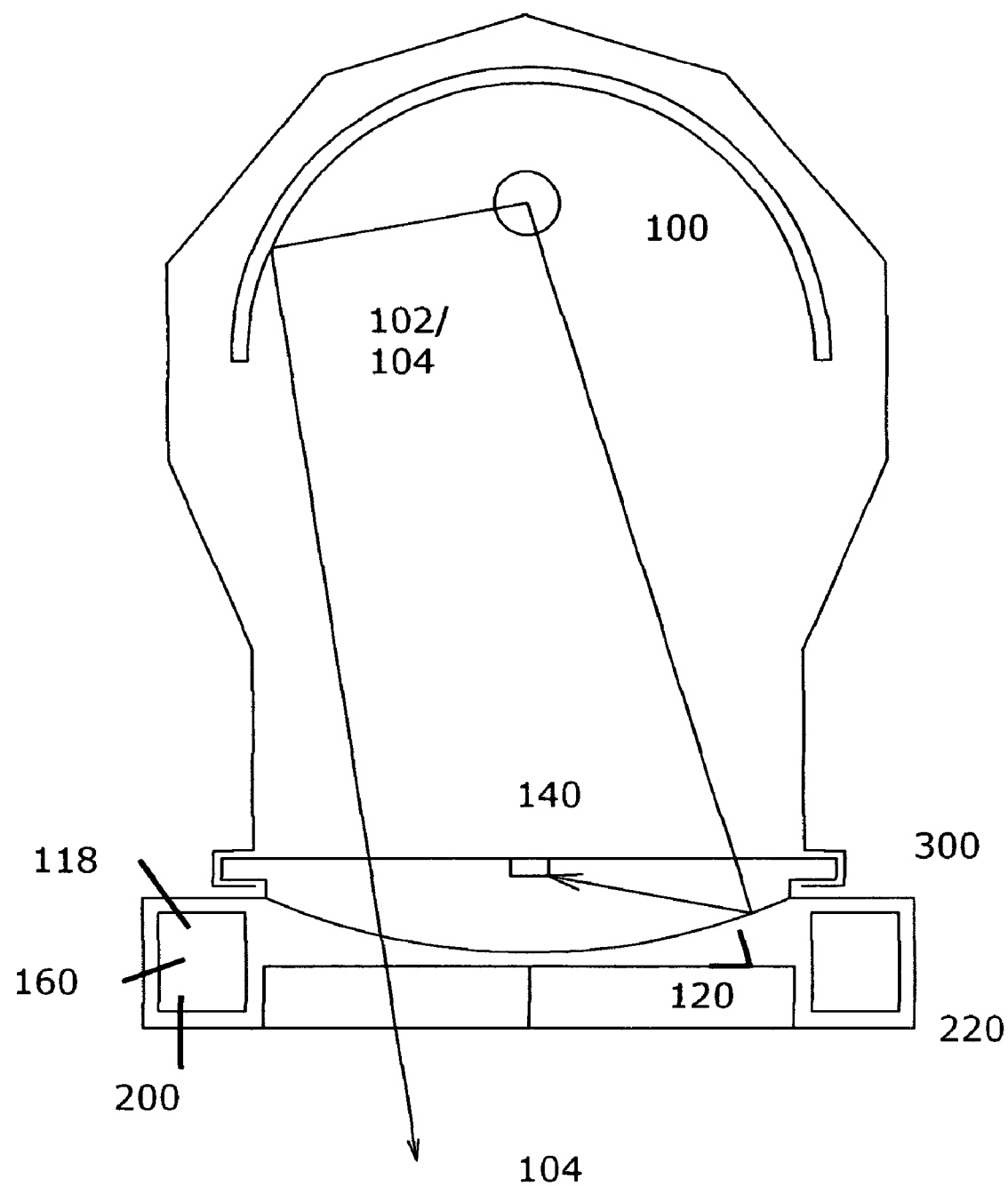

Fig. III-5
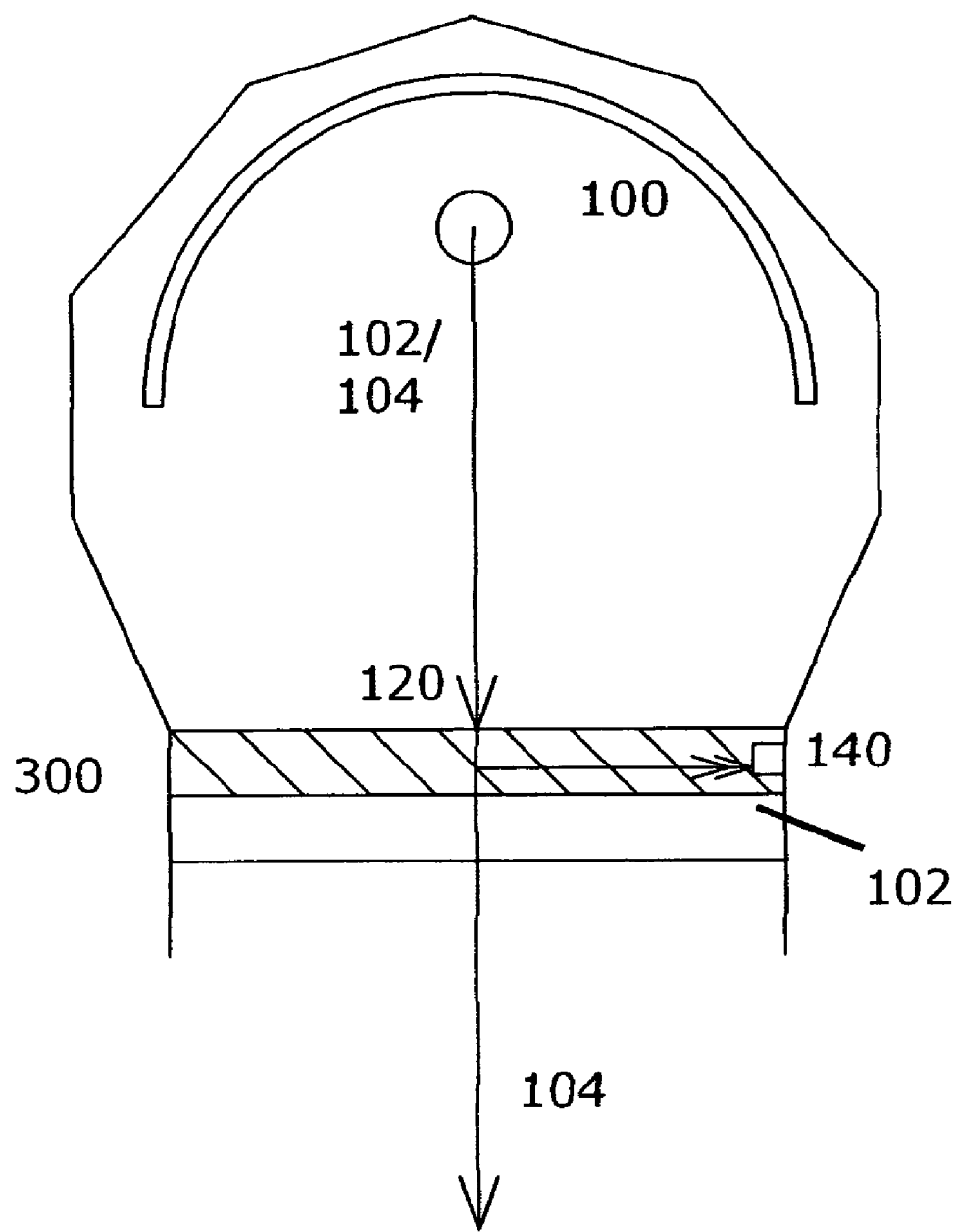

BEAM OPTICS AND COLOR MODIFIER SYSTEM

This invention incorporates by reference and claims the benefit of continuation-in-part status of U.S. patent application Ser. No. 10/941,461 filed on Sep. 15, 2004 now abandoned, a continuation-in-part of Ser. No. 09/793,811 filed Feb. 24, 2001 now abandoned; U.S. provisional patent applications Nos. 60/645,656 filed on Jan. 19, 2005; 60/683,176 filed on May 20, 2005, 60,696,733 filed on Jul. 5, 2005 and references document disclosures Nos. 576,577 filed on Apr. 30, 2005; 580,336 filed on Jun. 17, 2005; and 583,358 filed on Aug. 4, 2005.

FIELD OF THE INVENTION

This invention relates generally to illumination and optical systems, and specifically to beam color, direction and intensity fixtures used in architecture, entertainment, and instrumentation.

BACKGROUND OF THE INVENTION

Light beam optical and control systems applied illumination fixtures are well known and the subject of extensive invention for millennia including historic navigational lighthouses and beacons. With the advent of the carbide and electric light sources, applications included railroad search lights, automobile headlights and interior lighting. Architectural and theatrical lighting borrowed from extensively from these technologies.

Construction of an inexpensive, compact, high efficiency, color and intensity control system with acceptable image optics has been a long-sought goal and the subject of extensive invention. These systems are almost exclusively concentric, radial, aligned and axially symmetric.

Representative examples include patents by Naujoks, U.S. Pat. No. 1,045,063; Centeno, U.S. Pat. No. 2,186,203; Colao, U.S. Pat. No. 3,881,810 Gulliksen, U.S. Pat. No. 4,316,241; Solomon, U.S. Pat. No. 4,811,182; Bornhorst, U.S. Pat. No. 5,882,107; Callahan, U.S. Pat. No. 4,697,227; Richardson, U.S. Pat. Nos. 6,048,081, 6,142,652, 6,502,961; Wood, U.S. Pat. No. 6,796,683 and others. Construction of a compact, high resolution light beam modifier as disclosed by the prior art is expensive, inefficient or replete with visual artifacts.

SUMMARY OF THE INVENTION

Accordingly, it is an object of the present invention to provide a compact, highly efficient, high performance, color and light beam modifier system.

It is another object of the present invention to provide color and light beam modifier module for existing light fixtures.

It is a further object of the present invention to provide an improved, compact projector for the presentation of images.

Briefly, the source beam is conformed to a prescribed aperture which is controllably occluded by modifying optics and filters. In the single aperture embodiment, the form includes a constant pitch spiral which facilitates the equal radial occlusion at all radial distance. In the multiple aperture embodiment, the aperture form minimizes the conformational displacement, improves the increasing linearity and efficiency while reducing the cost of manufacture.

The conformational optics may also be employed to control beam spread and direction.

The present invention will be understood by reference to detailed drawing and specification.

FIG. II-2a-e present representative views of interaction of the spiral optical element;

FIG. II-3a-b present cross-section representative views optical elements;

FIG. II-2 presents an isometric view of a conformed, continuous light source embodiment;

FIG. II-3 presents a cross-sectional view of the preferred embodiment;

FIG. II-4A-C present a cross-sectional views of a movable optical element;

FIG. II-5 presents a cross-sectional view of the a movable enclosure and optical element;

FIG. II-6 presents a cross-sectional view of a movable LEE element;

FIG. II-7A-B present a cross-sectional views of a combined multiple, movable LEE/Optical elements;

FIG. III-1 presents a cross-sectional view of a energy recapture embodiment;

FIG. III-2 presents a cross-sectional view of a energy recapture embodiment;

FIG. III-3 presents a cross-sectional view of a energy recapture embodiment;

FIG. III-4 presents a cross-sectional view of a energy recapture embodiment;

FIG. III-5 presents a cross-sectional view of a energy recapture embodiment;

DETAILED DESCRIPTION OF THE DRAWINGS

Figure 1:
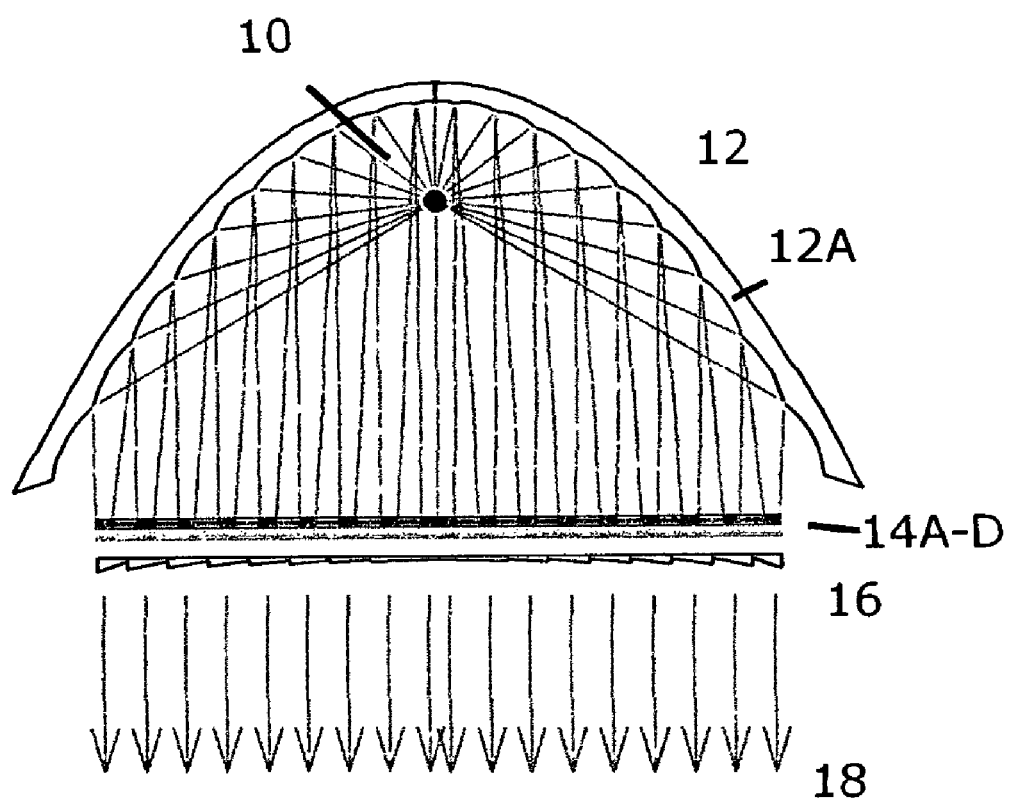
FIG. 1. shows a cross sectional view of a preferred embodiment of the present invention having a spiral patterned reflector and light modifying elements.
Figure 2:
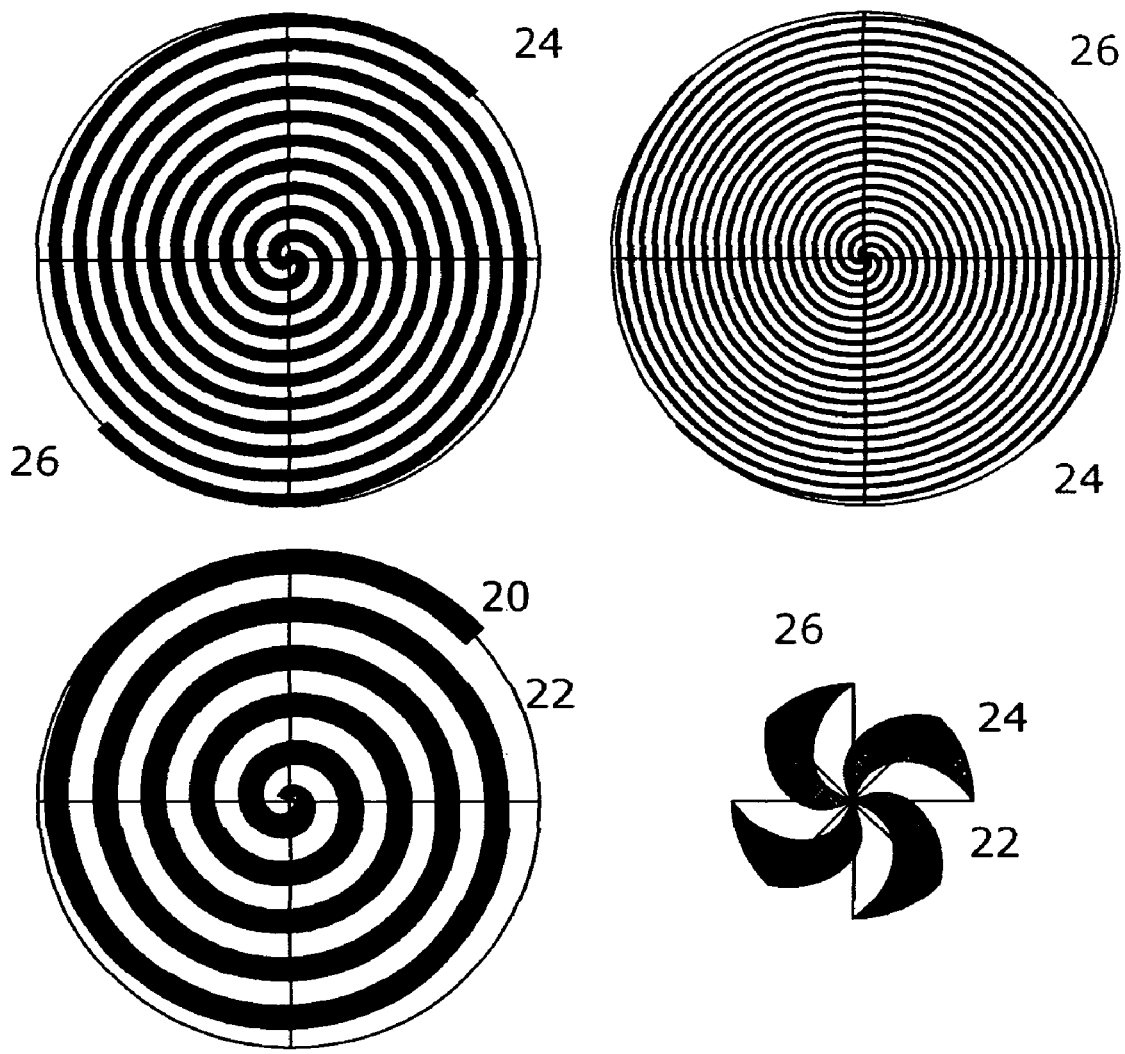
FIG. 2. shows the continuous regular single, dual, quad and central patterns of the light modifying ("LME") elements.

FIG. 1 shows a cross sectional view of a preferred embodiment of the present invention in the form of a illuminating light fixture having a light source 10 whose radiant output is directed to a reflector 12 having anamorphic elements 12A which transforms the light 18' into the spiral pattern of transparent region 20, as shown in FIG. 2, of the light modifying elements ("LME") 14A. The reflector may be constructed of mirrored reflective concave sub-elements 12A arranged as a corresponding spiral, reflective holographic optical elements, micro-optical mirrors, prisms, random refractive micro-optical elements or other known construction. In a preferred embodiment, the LME filters 14A-D are the subtractive colors, CYMK (cyan, yellow, magenta, and black), though a lesser or greater number of LME filters may be employed in a simplified or increased color gamut design. A first optical projection element 16 directs and focuses the beam as required.

Set for maximum output, the full light source 10 is reflected into a pattern which evenly traverses the transparent region 20 of the LME 14A-D filters. As the LME spiral pattern in FIG. 2A is rotated, it increasingly occludes the light beam causing a modification in color and intensity.

The LME pattern, shown in FIG. 2A, has a regular spiral pattern of a constant radial increment per revolution, alternating light modifying 20 and transparent 22 regions. In a preferred embodiment, the band width of the light modifying region 20 is slightly wider than that of the transparent region 22, such that when rotated 180 degrees ($\pi$ radians); the LME region 20 would completely occlude the slightly narrower transparent region.

A multiplicity of identical spiral patterns 24, 26 as shown in FIGS. 2B and 2C may be employed to reduce the angular displacement required for full occlusion. In operation, the pattern shown in FIG. 2C requires a rotation of 45 degrees ($\pi/4$ radians) for full occlusion.

Although not critical in many preferred embodiments of the present invention, FIG. 2D shows a variable band width 24, 26 during the first 180-270 degrees of rotation of the spiral to compensate for the unique geometric relationships. A variation in band width, and the relative width between transparent 22 and modifying bands 24 may be applied over the entire LME pattern to compensate for non-uniform illumination and optics.

Figure 3:
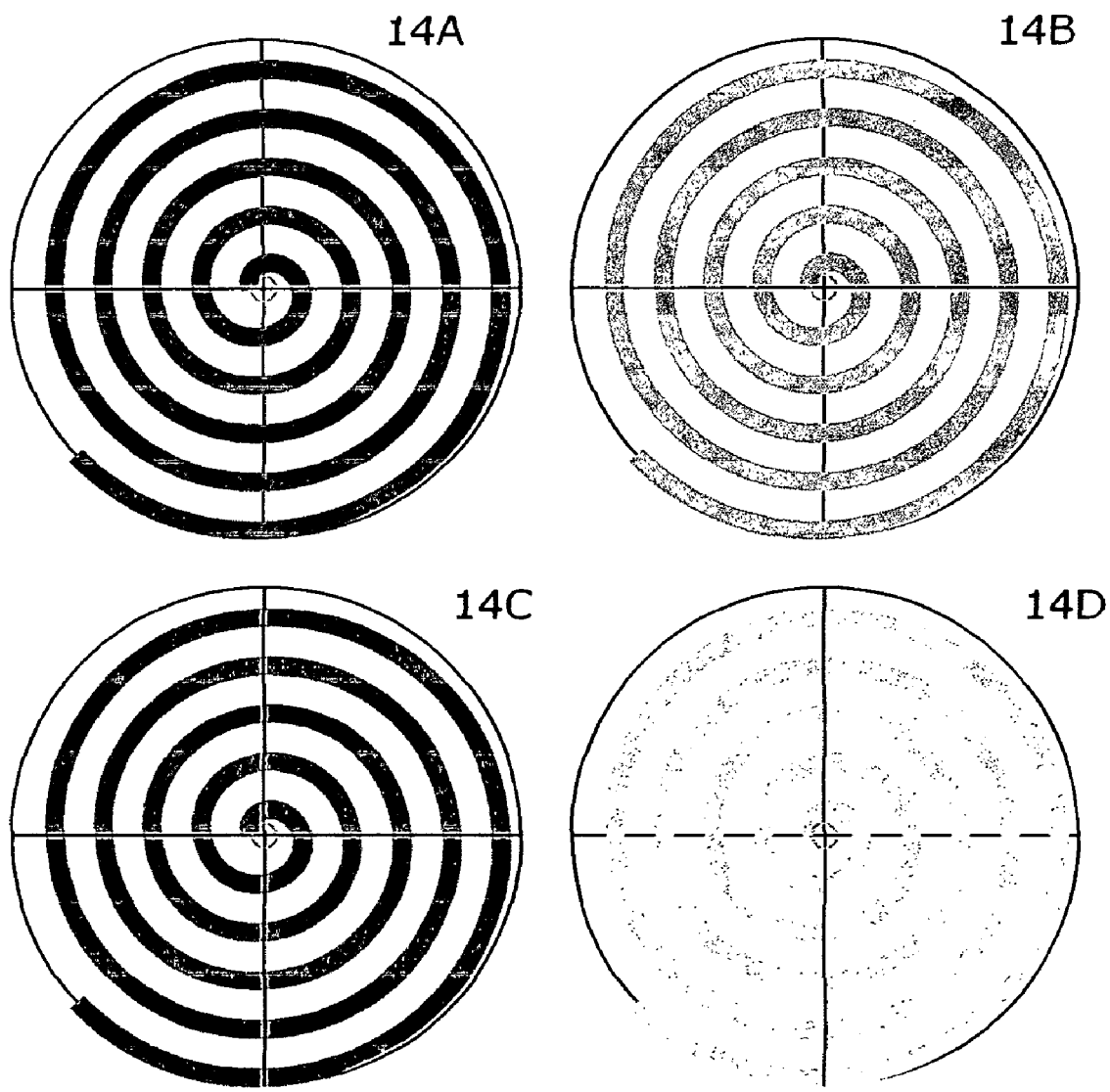
FIG. 3. shows the continuous regular single CYMK patterns of the light modifying ("LME") elements.
Figure 12:
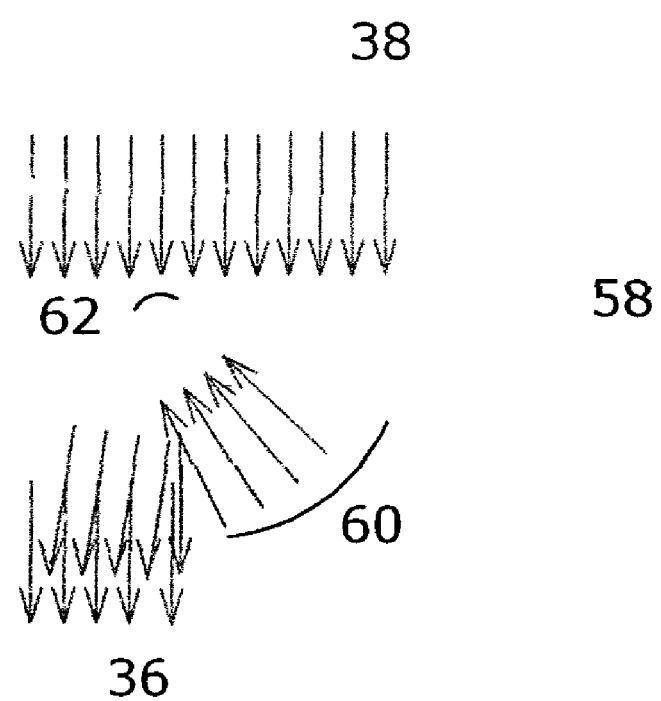
FIG. 12. shows a cross section of the reflective light recapture embodiment of the present invention.

FIG. 3 shows the CYMK LME filters 14A-D. As shown in FIG. 12, an additional, stationary LME mask with the pattern of LME 14A may be employed to increase the contrast and corrected for mechanical and optical imperfections.

Figure 4:
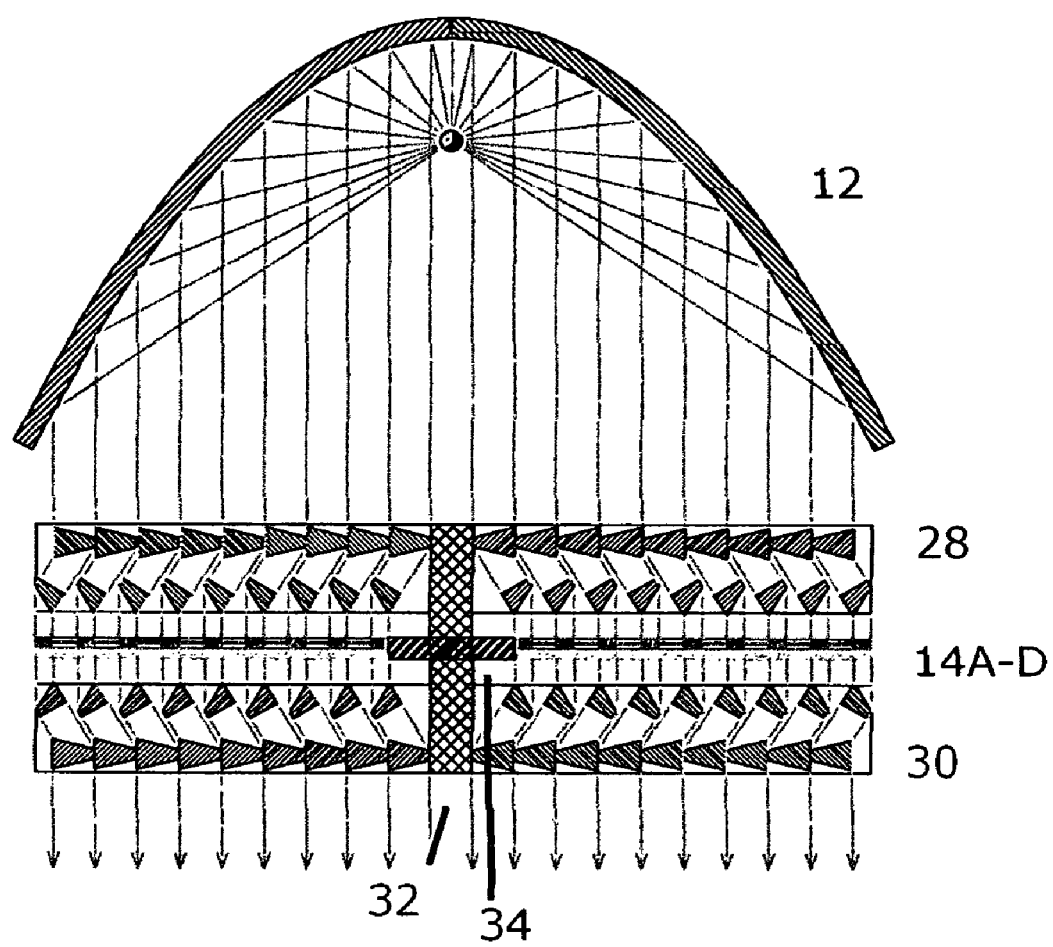
FIG. 4. shows the center hub embodiment of the spiral anamorphic prismatic embodiment of present invention.

FIG. 4 shows an anamorphic prism 28, 30 embodiment of the present invention where a uniform light beam is transformed in the LME pattern by a spiral patterned anamorphic prismatic optic 28. Following the traversal of the LME filters 14A-D, the pattern beam may be returned to its original or other form by a complementary anamorphic prism optic 30 or other lenses.

An axial centering shaft 32 upon which are rotatably mounted LME hubs 34 is shown. It may be understood that each LME filter may be independently mounted and rotated.

Figure 5:
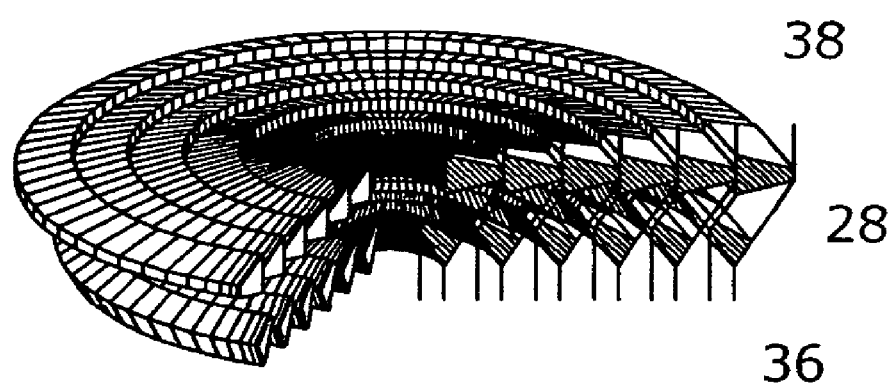
FIG. 5. shows a perspective, sectionalized view of the spiral anamorphic prismatic element FIG. 6. shows a intra-lens embodiment of the present invention.

FIG. 5 shows a perspective section of the spiral anamorphic prismatic optic 28 which transforms the first beam 38 into a narrower beam 36. Anamorphic prisms and optics are well known in the optical literature and many prismatic, mirror and lens variations may transform into the preferred spiral pattern of the present invention.

Figure 6:
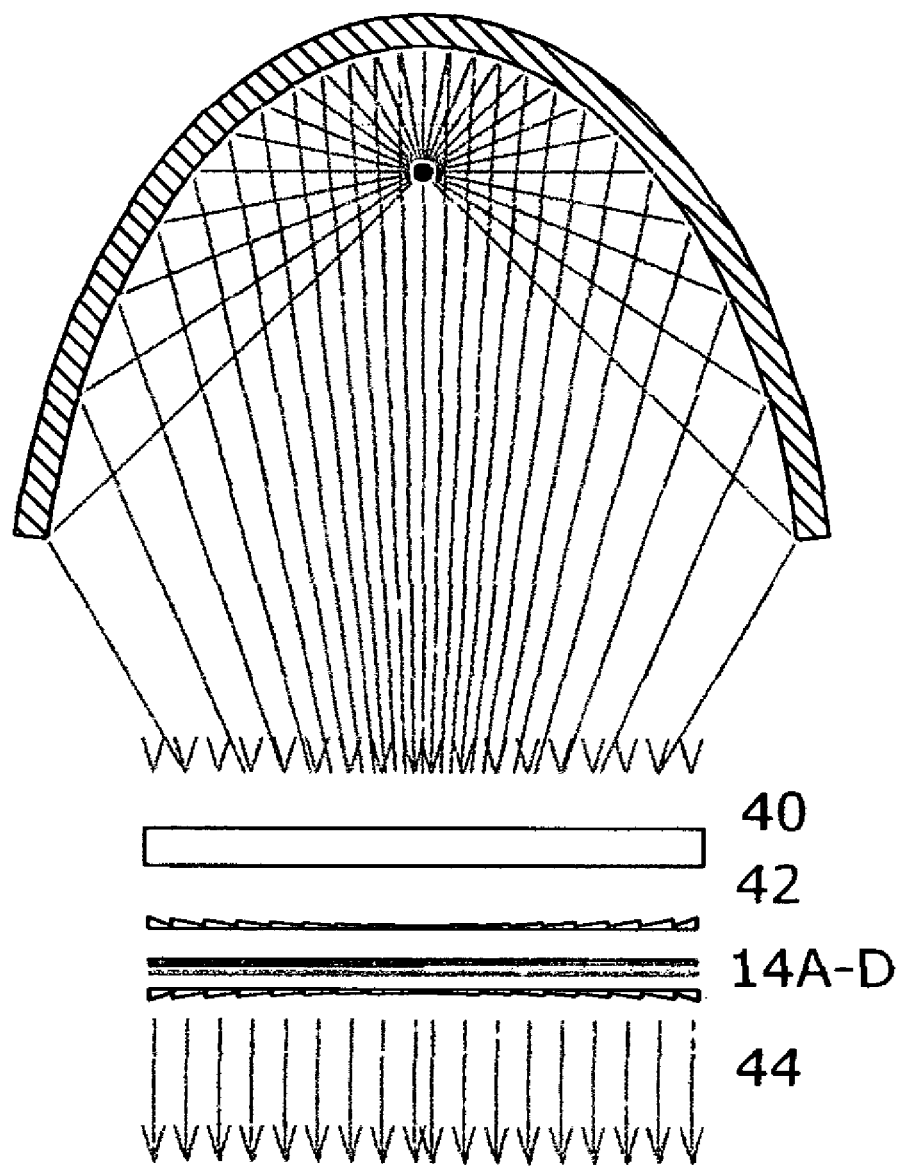

FIG. 6 shows an fixture embodiment having a reflector 12 and a first optical system 40 which may optionally include one or more condenser optics, an fixed or variable aperture stop, an iris, a slide, gobo or film slot.

The reflector 12 may also include a spiral pattern as shown in FIG. 1. Optionally, a first anamorphic projection element 42, which may be a spiral pattern fresnel lens, directs the beam through the LME filters 14A-D. A second projection element 44 may be employed to further focus and shape the beam into the desired image.

Figure 7:
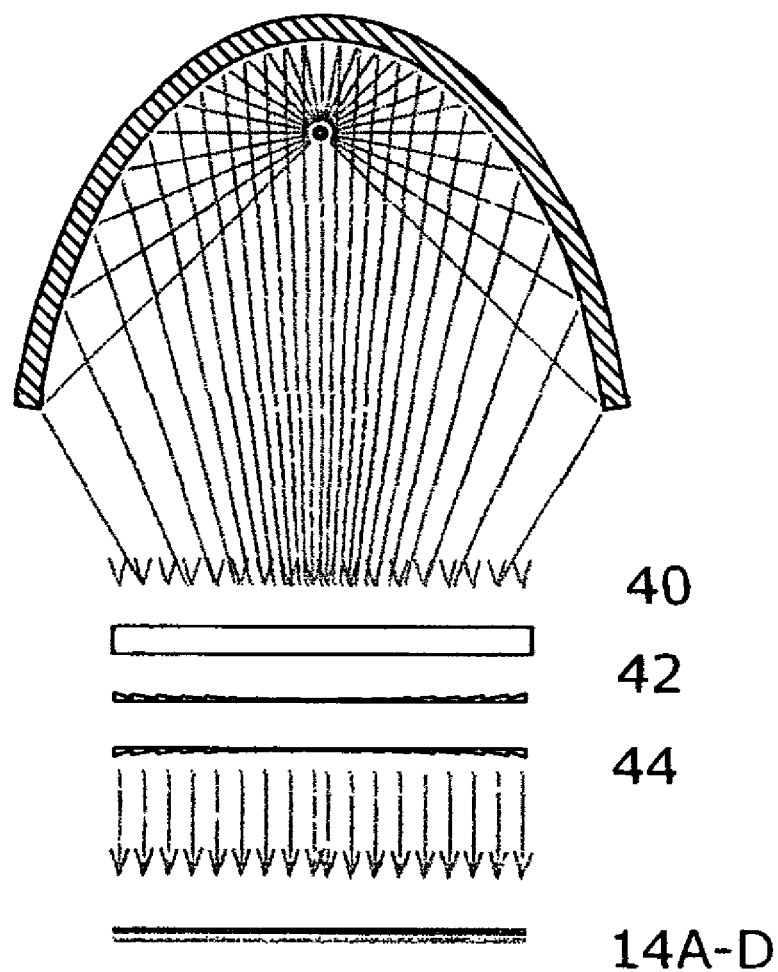
FIG. 7. shows a post-lens embodiment of the present invention.

FIG. 7 shows a fixture embodiment where the LME filter 14A-D are placed distal to the projection optics 42 and 40.

Figure 8:
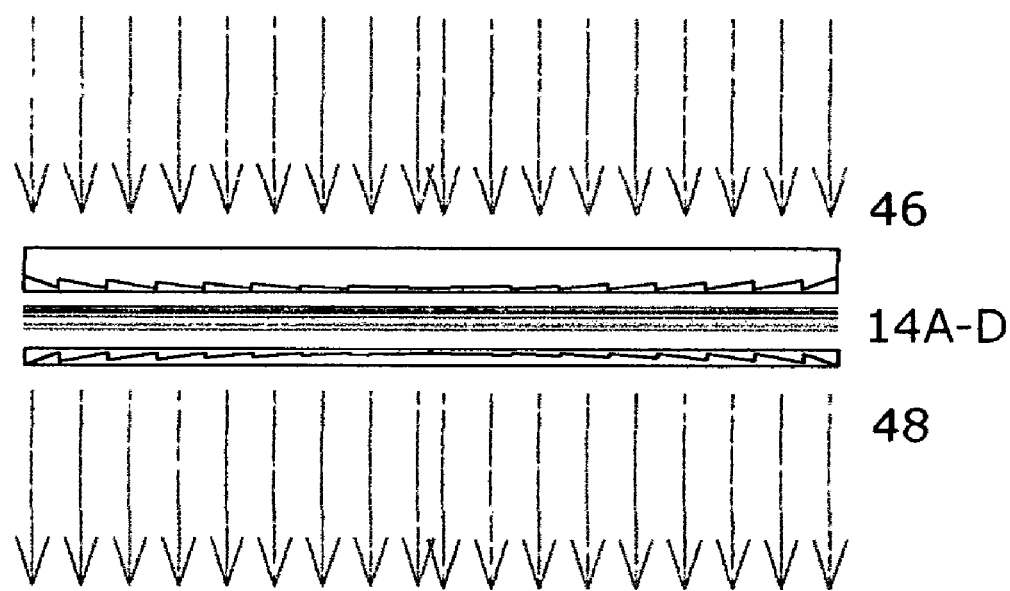
FIG. 8. shows a cross section of the free-standing, spiral fresnel, reflective light recapture embodiment of the present invention.

FIG. 8 shows a free standing LME fixture embodiment where complementary anamorphic design projection optics 46 and 48 are employed to construct a light modifying component which does not materially alter the focal characteristics of the beam.

Figure 9:
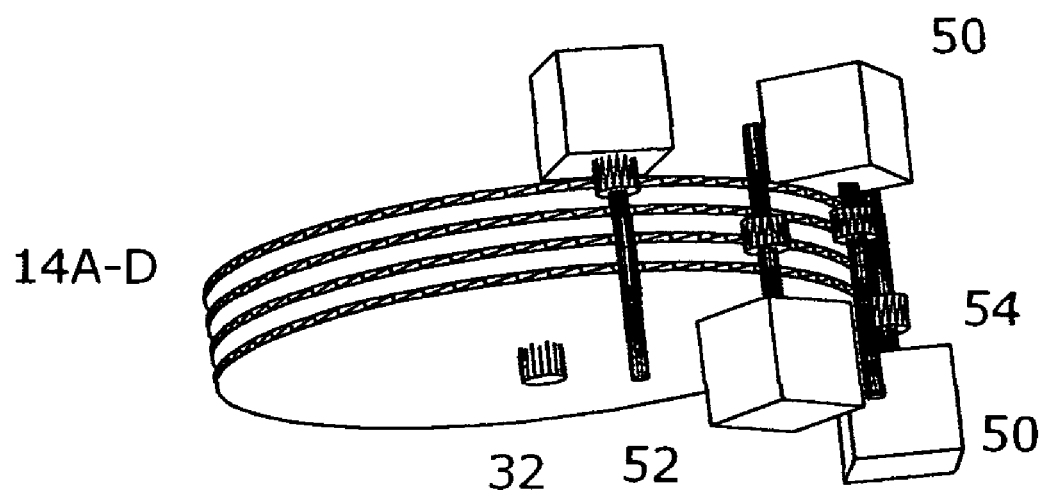
FIG. 9. shows a axial centering shaft embodiment of the present invention.

FIG. 9 shows the LME actuators comprised of a motor 50, a motor shaft 52 and a LME filter drive wheel or gear 54 and an axial centering shaft 32. It may be understood that may physical, mechanical, electronic or other known means may be employed to rotate the LME filters 14A-D, including but not limited to hand-operated arms; stepper, wave and servo motors; voice-coil, piezo and other linear actuators.

Figure 10:
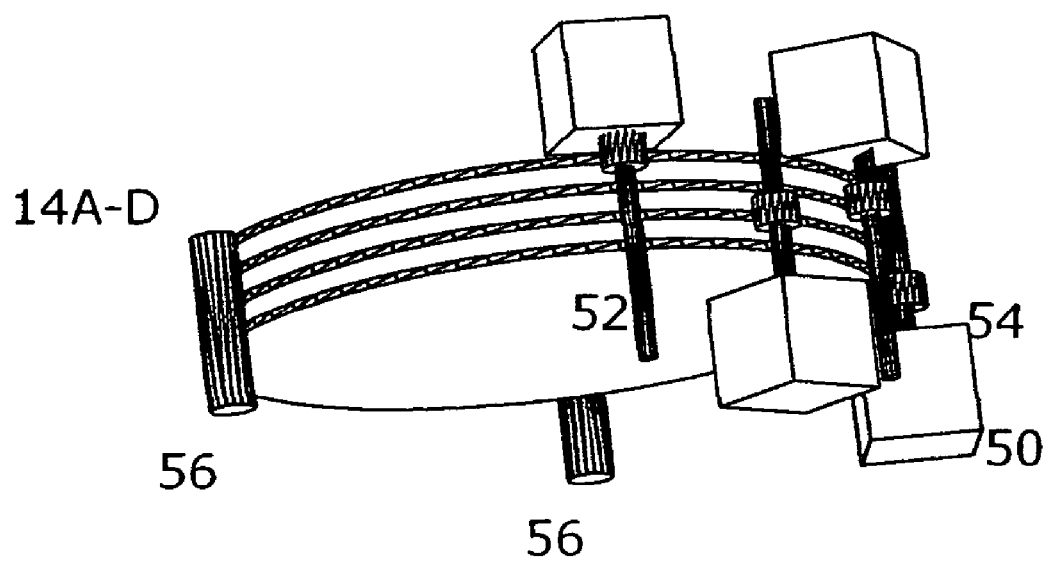
FIG. 10. shows a circumferential roller embodiment of the present invention.

FIG. 10 shows a circumferentially supported LME filter construction having an actuator roller/gear 54, and two or more circumferential rollers 56.

Figure 11:
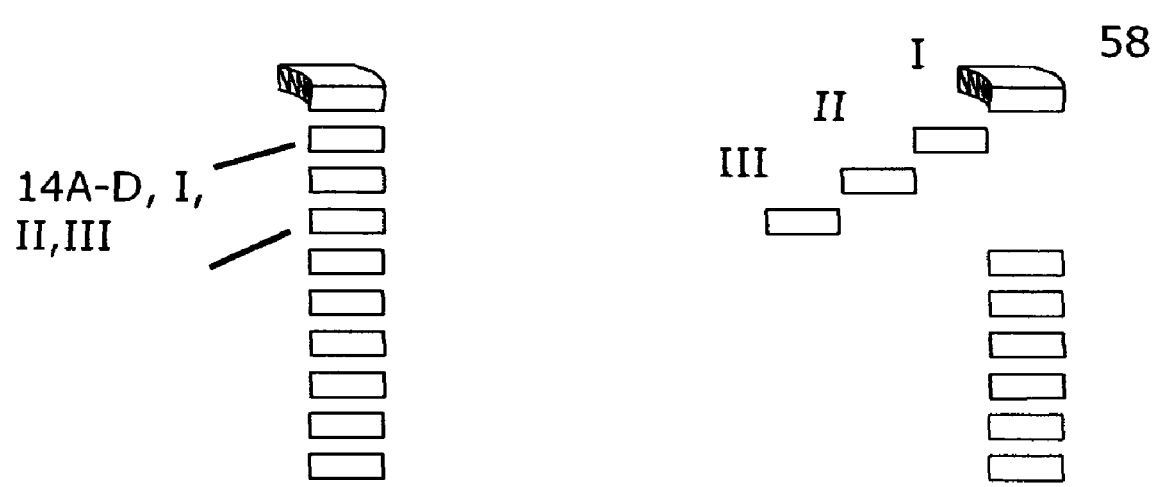
FIG. 11. shows a perspective view of reduced width, repetitive LME embodiment of the present invention.

FIG. 11 shows an alternatively LME filter construction permitting a greater transparent region 22 as shown in FIG. 11A by having each LME color comprised of three inter-related bands I, II, III which act cooperatively to effect full occlusion as shown in FIG. 11B.

FIG. 12 shows a cross-section of a first spiral LME anamorphic mask having a reflective surface 60 which reflects the incoming beam 38 to a recapture reflector 62 and then through the normal pattern transparent region as the combined and narrowed beam 36. Alternatively the first reflective surface 60 may directed the beam into the first reflector 12 (not shown). The first LME mask 58 may be stationary. Other light recapture systems are well known and may be employed in the present invention to increase the light transmission through the transparent region 22 and fixture.

Figure 13:
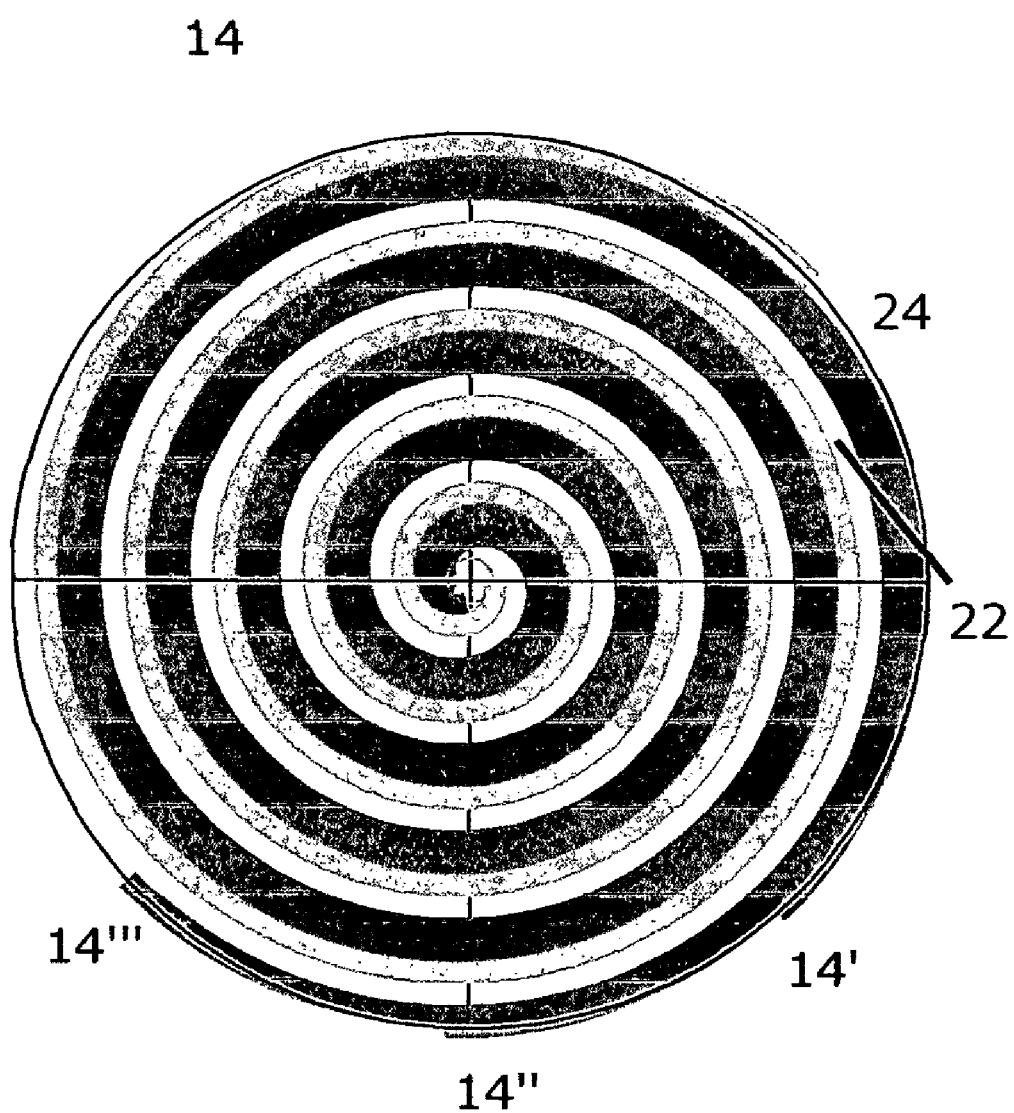
FIG. 13. shows a spiral pattern with a substantially narrower transparent region and the LME filter 14 graduated radially.

FIG. 13 shows a spiral pattern with a substantially narrower transparent region 22 and the LME filter 14 graduated radially 14',14'',14''' to include a region of full spectral occlusion at least the width of the transparent region. This embodiment results in a finer color modulation.

Figure 14:
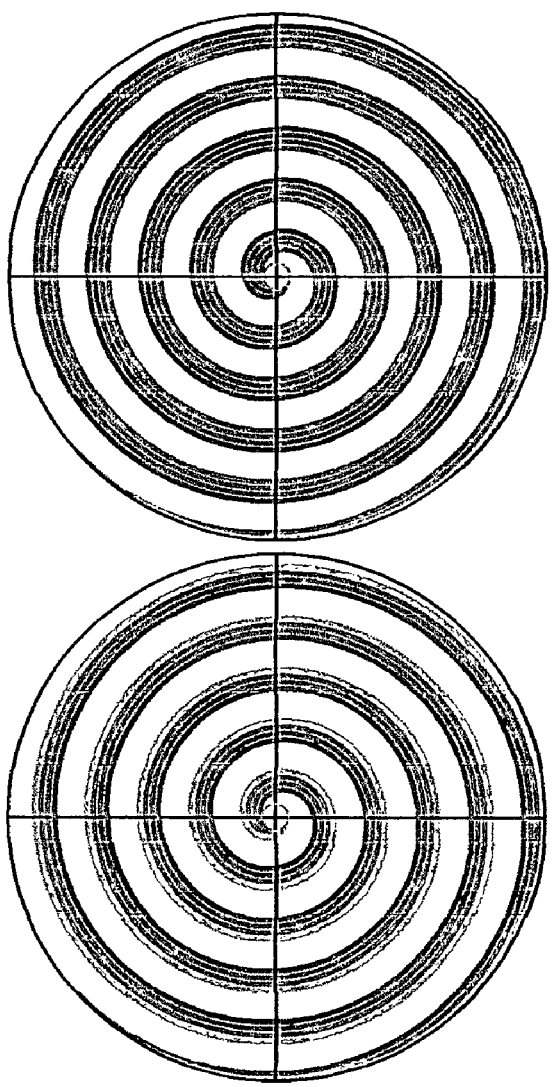
FIG. 14. shows a preferred embodiment having opposing graduated LME filters.
Figure 14A:
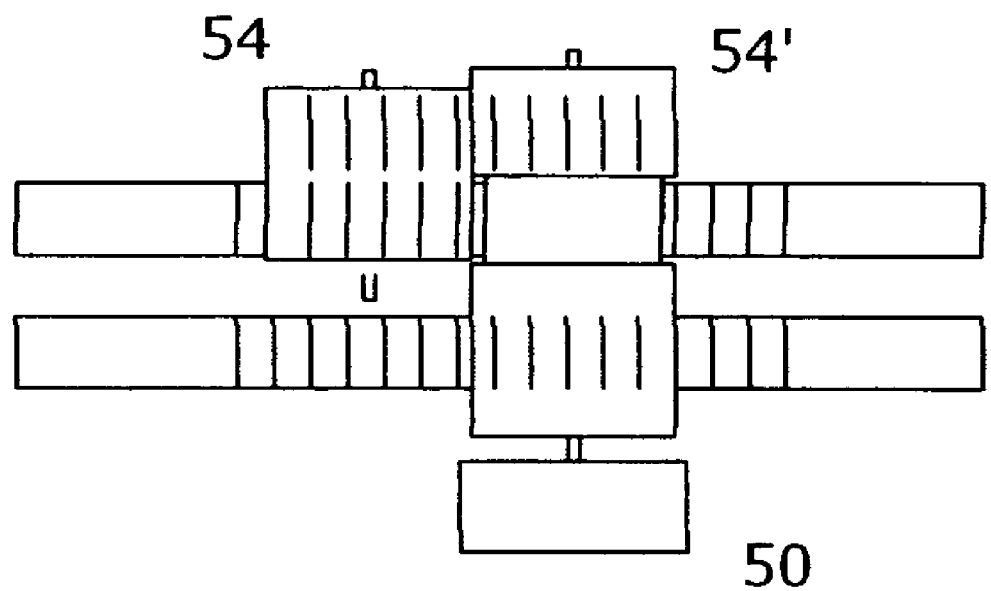
FIG. 14A shows a preferred embodiment of a reversing dual gear system.

FIG. 14 shows approximately equal transparent and occlusive regions where the LME filters 14 I, II are graduated radially (14'-''', 14'''-'). The rate of graduation may be linear or geometric. While this doubles the number of LME filters required for a straightforward embodiment of the present invention, it further increases the smoothness of the transitions and permits subtle variations in color of the filter graduations to increase the color gamut. This element may be complemented by an opposing graduated filter operated by an integrated drive train including but not limited to a jointly opposing, articulated arms; a second roller/gear 54 through a reversing multiple gear 54' driven by the same actuator motor 50 shown in FIG. 14A; or independent controls. Other ratios between the transparent and occluded regions; and patterns may be employed.

Figure 15:
FIG. 15. shows a preferred embodiment of a single aperture spiral.
Figure 15:

FIG. 15 shows a continuous spiral pattern 14 generated from a rectangular aperture 14R.

The present invention discloses new method and device perfecting the uniform, fine resolution modification of a light beam by a physically displaced filter. This is achieved by conforming the incoming beam to a specific spiral pattern and rotating a light modifying filter of a similar pattern about an axis.

The filter and optics may be conformed to a conical or hemispheric shape, with multiple filters per color and any number of colors and hues.

While the figures show the LME as uniform, they may also include a nearly unlimited combination of artistic patterns to impart the artist's effect.

The lamp output is transformed into a spiral pattern whose width in less than 50% of the inter-ring width, and the modifying region width is at least the width of the greatest diametrical width over the region of operational displacement. In practice, the eccentricity imparts a maximum increase in the band width of approximately 1.5% at the radial of the first revolution, decreasing to unity thereafter.

While the center hub construction obviates the need for special measures to maintain uniform occlusion during operation, the modification of the illumination pattern and modifier band width to maintain the unity relationship between angular displacement and occlusion may be incorporated. Practically, for most applications this need be applied during the first 180 degrees of the spiral revolution only, although for critical precision it may be applied over a greater number of revolutions.

Optionally, a second optical element may be a conjugate spiral, diffuser, normal lens or other shape. It may be understood that where the present invention is situated between an object and image, a complementary optical shape which eliminates chromatic and optical aberrations introduced by the first optical element may be employed. Where the present invention situated between a light source and the object, a diffuser or other condensing elements may be employed.

The second optical element may be a fresnel or classic lens, optionally incorporating complementary optics to correct the slight spiral skewing of the beam.

While the unitary spiral shown, other parametric relationships may be employed. In particular, a unitary spiral (radius=C*angular rotation) with a spiral line width of greater than 50% of radial distance at $2\pi$ and a concentrator aperture width of less than 50% of the radial distance at $2\pi$ would correct for the divergence of the beam through the modifier elements.

Additional sub-sections may be employed to correct chromatic and focal aberrations. It may be understood that a spiral fresnel lens may be considered a continuous integration of sections of standard optical elements such as lenses and prisms. Well-known methods for correcting first, third and other order optical aberrations may be similarly employed.

Additionally, one or more LME may be an irregular spiral thereby creating a non-uniform pattern. For example, by increasing (or decreasing) the spiral line width relative angular distance, the exit aperture may appear to deferentially contract or expand with radial distance. Irregular and discontinuous patterns may be employed to produce a multiplicity of visual effects.

Partial Summary of Variations
1. Spiral fresnel lens
    a. With composite construction
    b. With co-axial correction
2. Spiral light concentrator
    a. With anamorphic prisms
    b. With grin lenses
    c. With tapered fiber optics
    d. With refractive cross-section
    e. With prismatic cross-section
    f With TIR prismatic cross-section
    g. With composite construction
        i. With chromatic correction
        ii. With axial correction
3. spiral beam modifier
    a. In conjunction with mask
    b. In conjunction with spiral light concentrator
    c. In conjunction with light recapture reflector
    d. With regular pattern
        i. Equal to aperture
        ii. Unequal to aperture
    e. With irregular pattern
4. Beam Modifier System
    a. With first light concentrator
    b. With second light concentrator
    c. As condenser
    d. As diffuser
    e. As projection lens
5. spiral reflector
6. reflector with spiral output
    a. direct spiral—
    b. repeated domain spiral
7. paraboloid
    a. anamorphic prism spiral
    b. concentrator
    c. other
8. ellipsoid
    a. anamorphic prism spiral
    b. concentrator
    c. other
9. Registration for LME
    a. Optical/Mechanical/Resistive encoder
    b. Stepper motor
    c. Servo
    d. Home Position diode/switch The fresnel spiral reflector and lenses may be constructed in a constant or graduated form, and may incorporate may of the features disclosed in the relevant prior art including but not limited disclosures in the following patents:

| | | | |
|---|---|---|---|
| 4,456,344 | Bordignon | 1984 | Spiral Fresnel Lens Manufacture |
| 4,350,412 | Steenblik | 1982 | Fresnel Spiral Reflector |
| 2,510,344 | Law | 1950 | Spiral Fresnel Lens |

The lenses may be incorporated into one or more the LME filters. Further details related to the design of the fresnel spiral reflector are the subject of a co-pending application.

Light qualities include but are not limited to color, intensity, dispersion, direction, polarization, and phase.

The embodiments of the invention particularly disclosed and described herein above are presented merely as an example of the invention. Each embodiment may be used independently. Other embodiments, forms and modifications of the invention coming within the proper scope and spirit of the appended claims will, of course, readily suggest themselves to those skilled in the art.

Figure 16:
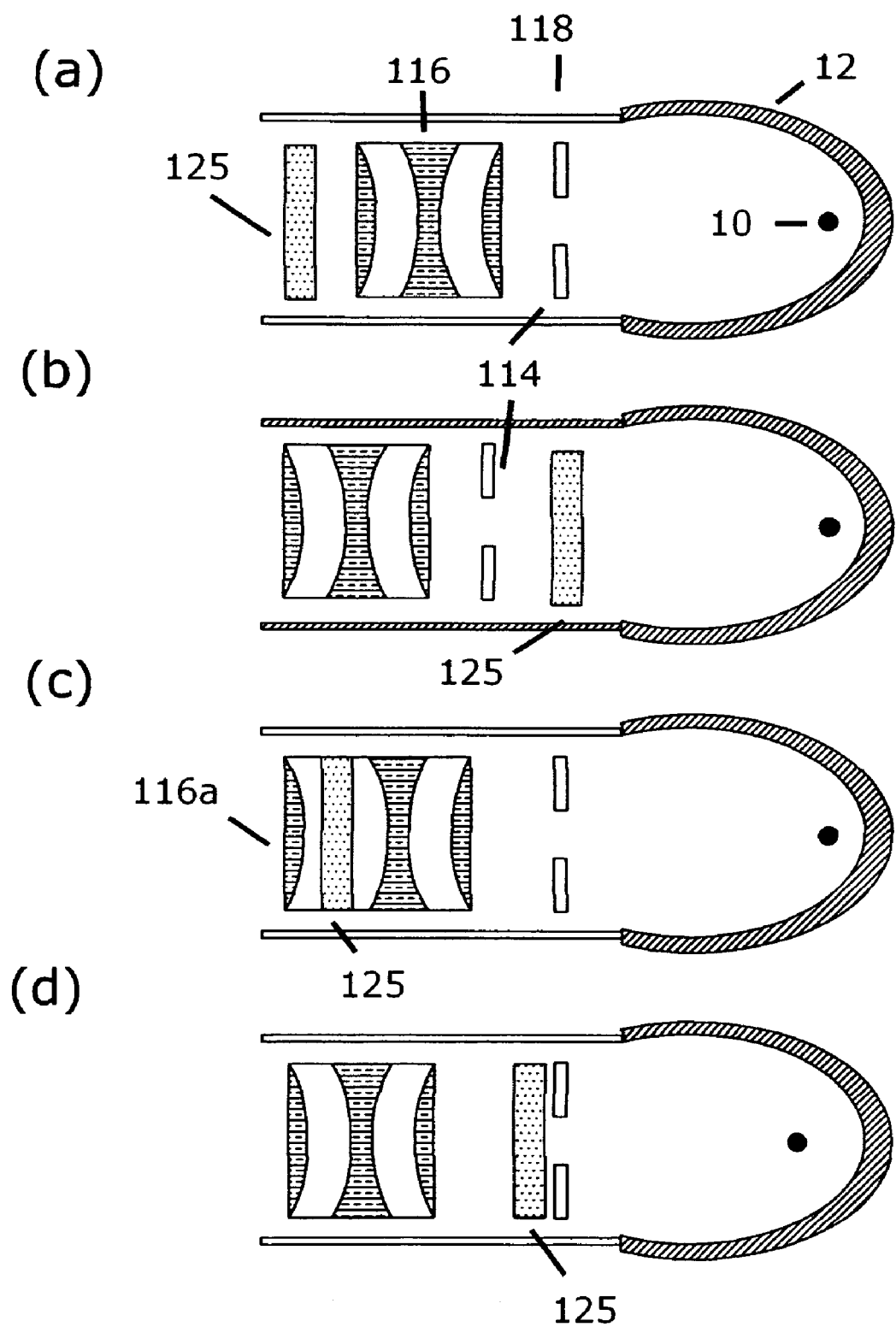
FIG. 16. shows a preferred embodiment of a the placement of the LME system.

FIG. 16 presents the general elements of the light fixture of the present invention having a light source 10 concentrated by a reflector 12 on an iris 118 imaged by a projection lens 116. The output is modulated by a color modifier element 125 which may be positioned after the projection lens, before the iris (b), within the projection lens (c), or between the iris and the projection lens (d).

Figure 17:
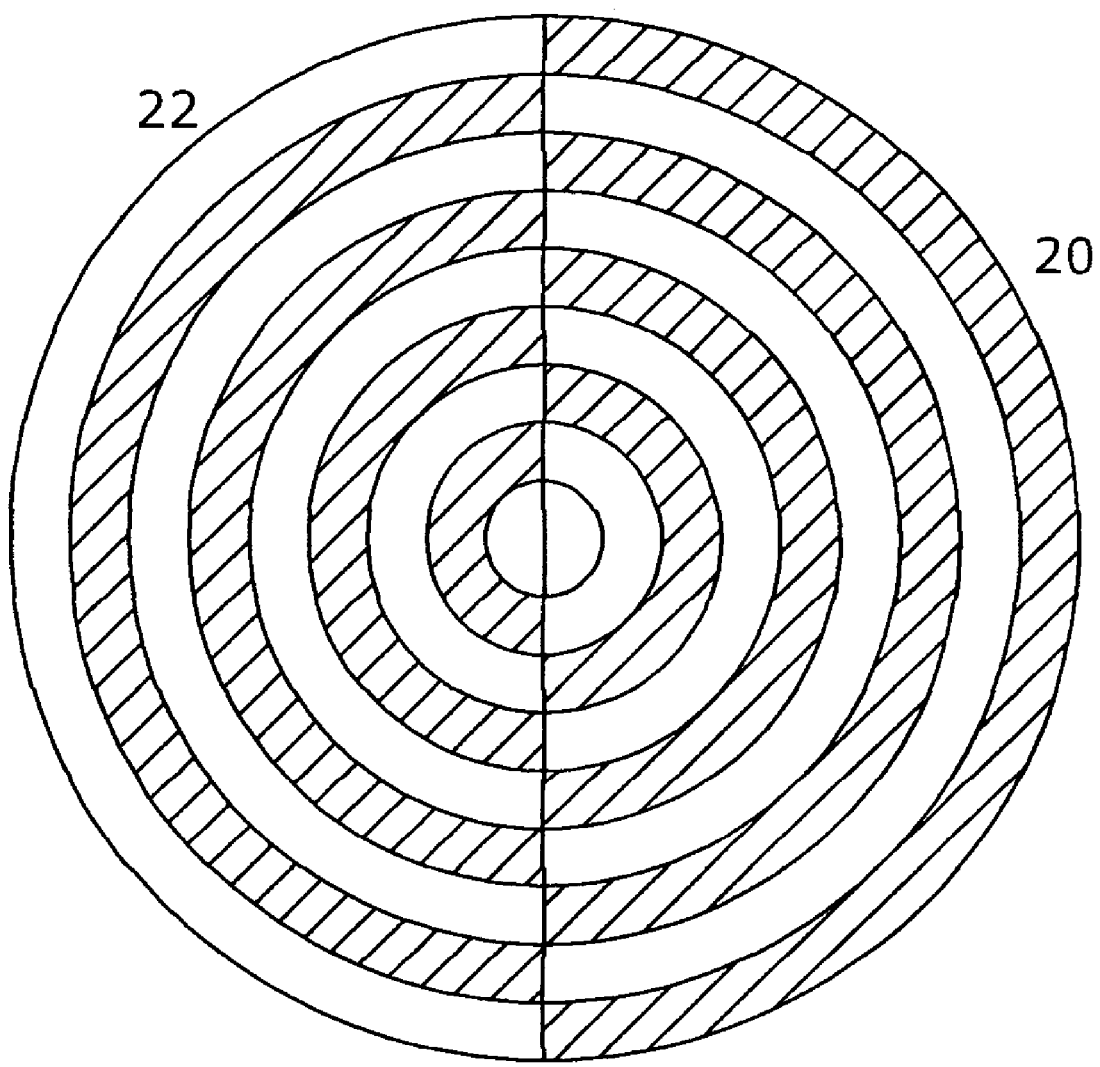
FIG. 17. shows a preferred embodiment of a concentric radial displacement LME systems.

FIG. 17 present a simplified version of a rotational color filter 14 having a colored region 20 and a transparent or void region 22. In operation, the first anamorphic optics 50 conforms the beam to the transparent regions 22 and the color regions 20 of filter 14 is rotated to occluded the desired portion of the beam.

Figure 18:
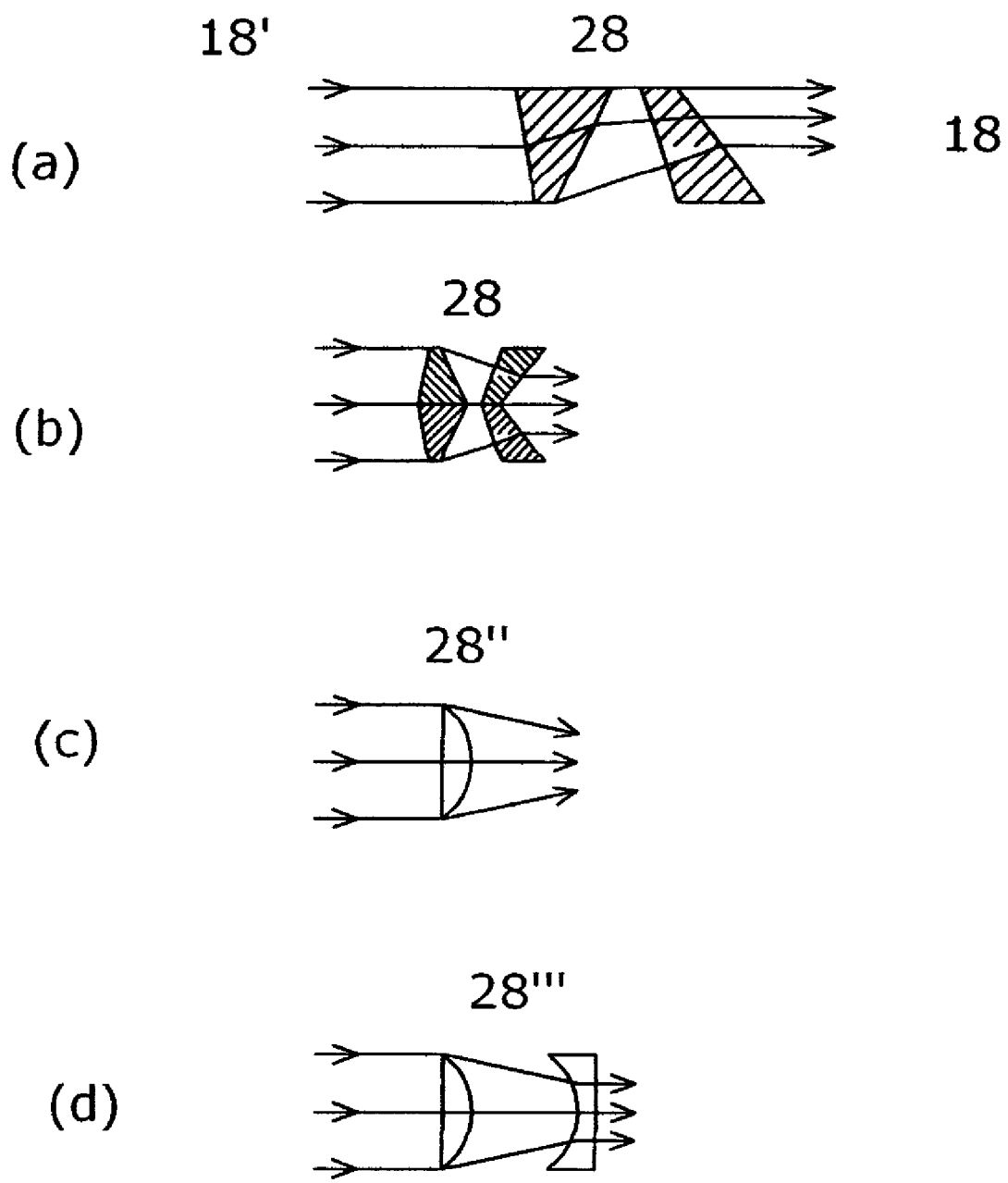
FIG. 18. shows a cross-section of offset and central efficiency optics.

FIG. 18 presents embodiments of the anamorphic optics where the first embodiment (a) is a cross-section of the prismatic optics 28 which reduces the incoming beam 18' to approximately 50% of its height offset to one side. In a rotational embodiment, this cross-section is one of an array which are rotated about the central optical axis.

A second embodiment (b), the prism elements 28' are arranged to produce a centered output beam 18.

A third embodiment (c) is an anamorphic focusing optic 28" which may be employed in the present invention. When a focusing optic is employed, the anamorphic properties where the circumferential dimension is maintained and the radial dimension is reduced permits even occlusion. This effect may be employed with complex incoming beams 18'.

A four embodiment (d), the focusing optics 28''' are arranged to produce a centered output beam with parallel qualities.

A second reversing anamorphic optic (shown in FIG. 3) may be employed to transmit a iris image or modify the output beam.

Figure 19:
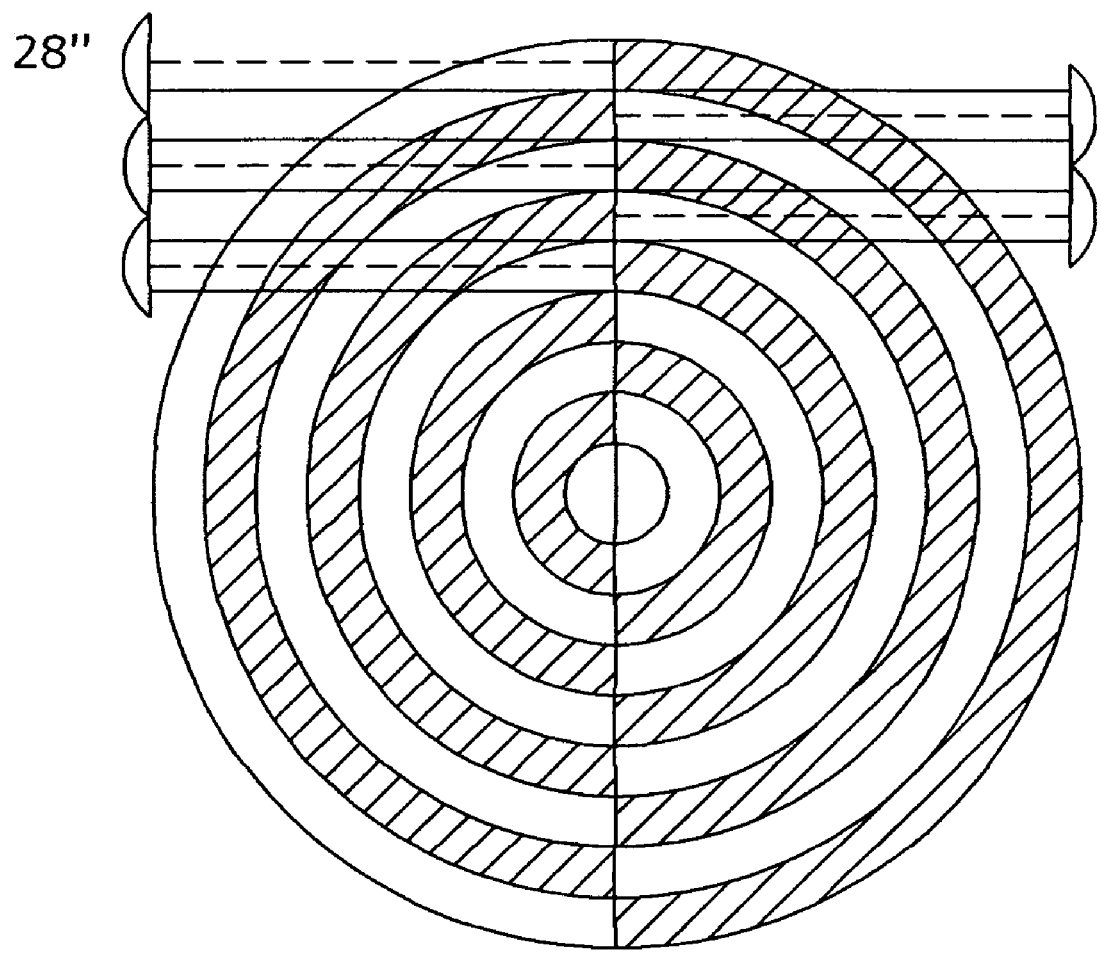
FIG. 19. shows a composite view of central efficiency optics and LME systems.

FIG. 19 presents a cross-section of the anamorphic optics 28' together with an axially view of the color filter showing the offset arrangement of the optics 28' to align with the center of the transparent region.

Figure 20:
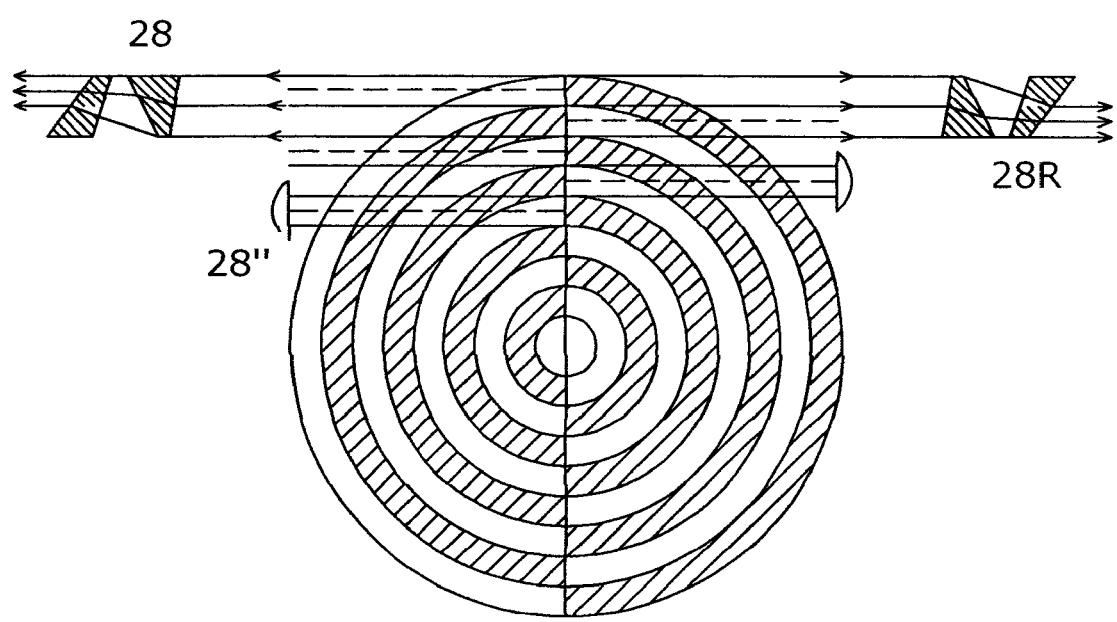
FIG. 20. shows a composite view of central and offset efficiency optics and LME systems.

FIG. 20 presents a comparison of the paired offset anamorphic optics 28, 28R with the offset centered optics 28.

Figure 21:
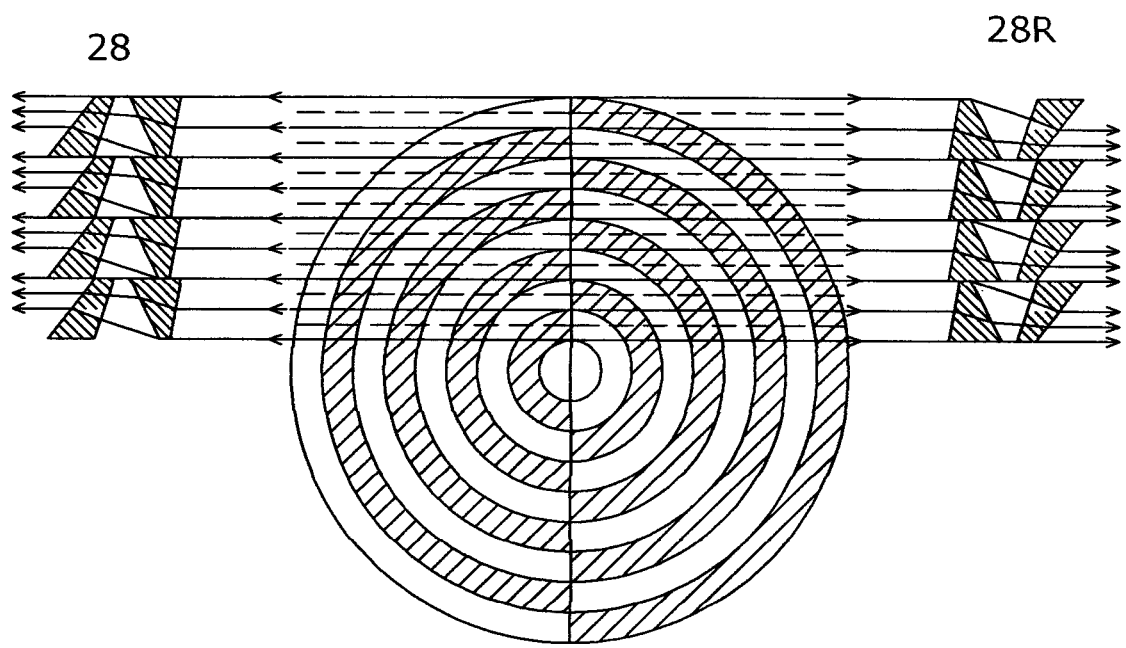
FIG. 21. shows a composite view of offset paired efficiency optics and LME systems.

FIG. 21 presents four paired concentric groups of anamorphic optics 28, 28R.

Figure 22:
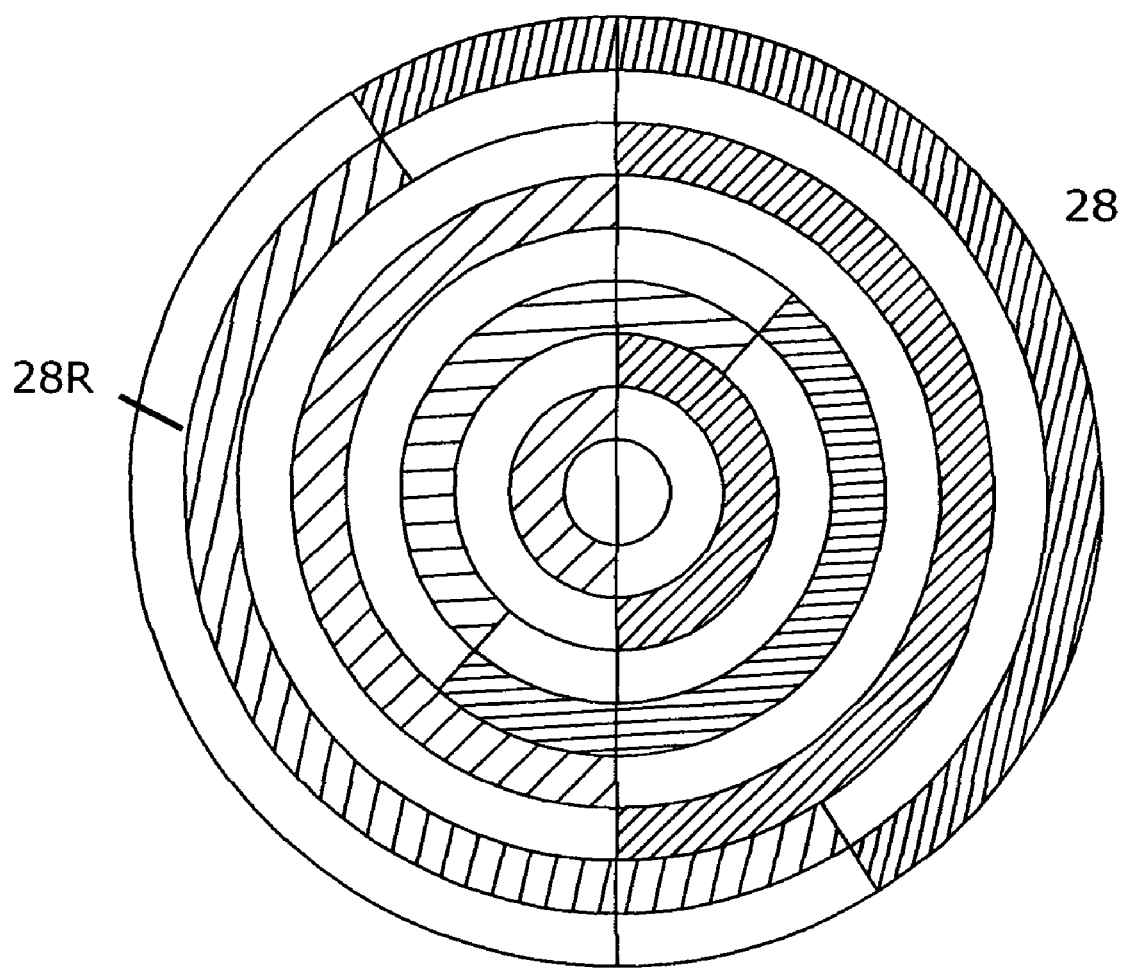
FIG. 22. shows a paired rotated LME systems

FIG. 22 presents the independent rotation of each of the four groups 28, 28R shown in FIG. 21, an attribute of the present invention which produces an increase in the evenness of the image field.

Figure 23:
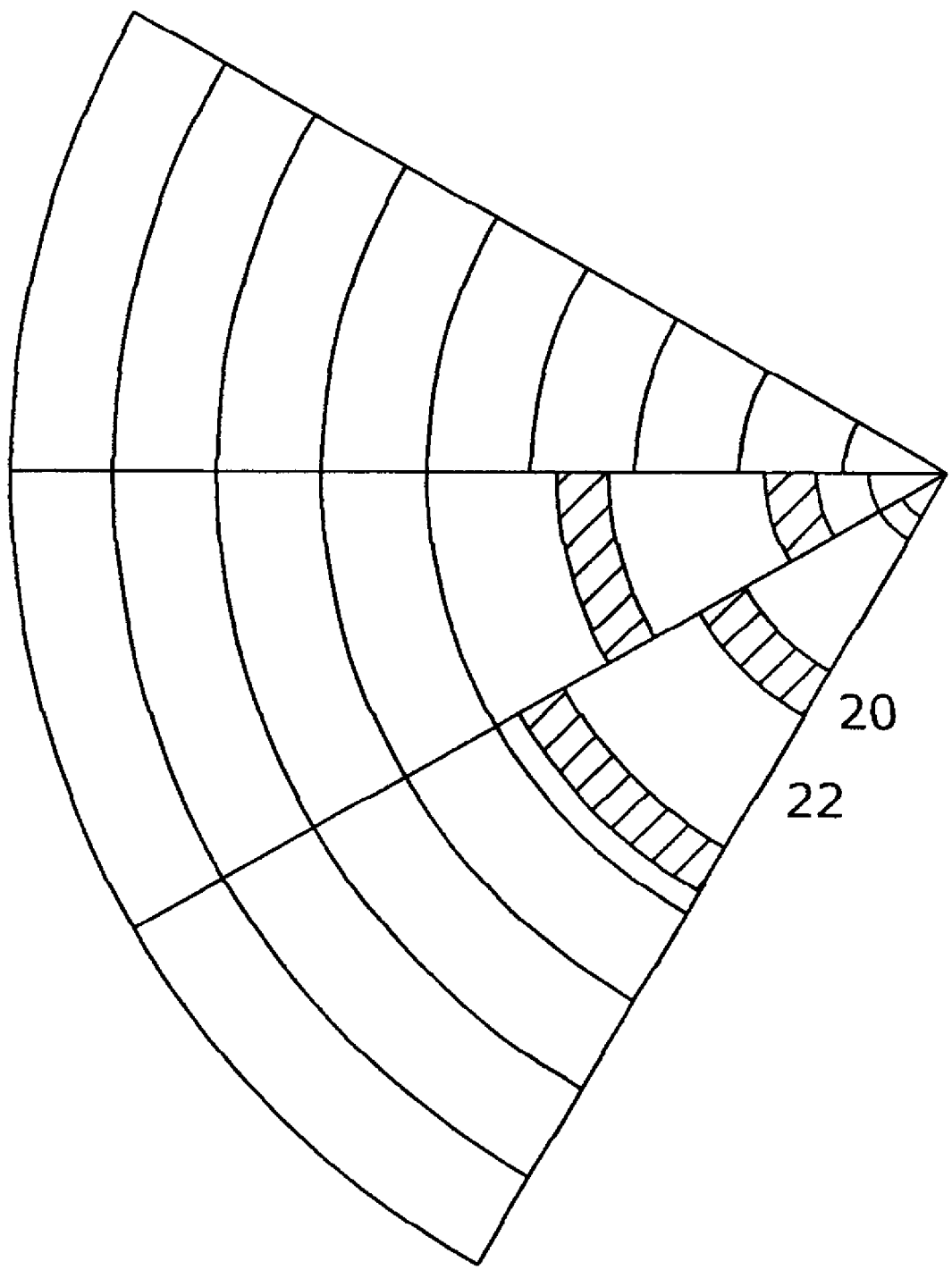
FIG. 23. shows a 25% LME systems.

FIG. 23 presents an example of increased anamorphing greater the 50%.

Figure 24:
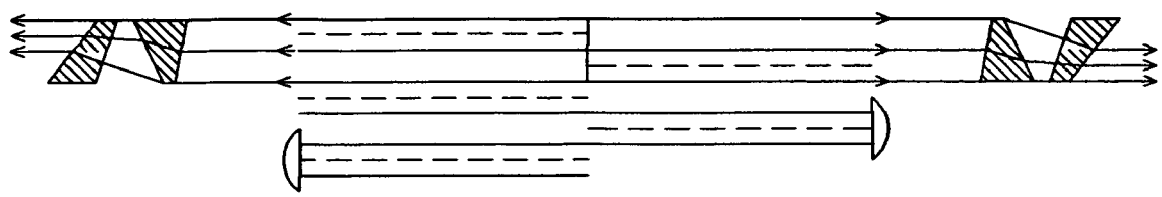
FIG. 24. shows a composite view of a offset paired optics applied to a rectangular LME system.
Figure 24:
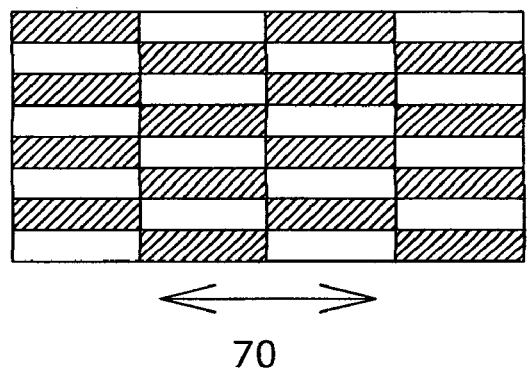
Figure 24:
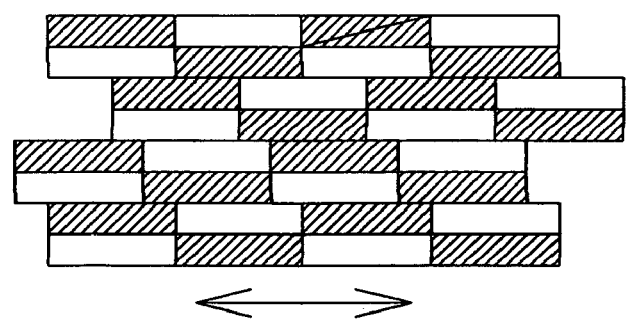

FIG. 24 presents the present invention applied to a linear arrangement where the displacement is linear 70. Displacement may be by an means including but not limited to a motor, servo, stepper, voice-coil, piezo-stack, beam, etc. In operation, one or more additional actuators including but not limited to a piezo-stack or beam, voice coil, electrostatic, thermal or other device, may be dynamically applied to maintain the perfect lateral alignment of the optical elements, using a reference guide which may include an optical line sensed by dual optical sensors.

The linear optical anamorphic optics may be constructed from one linear arrays, sliced and offset.

Conformed Light Source

Well-known light sources include filaments, electric arcs, fluorescent, gas discharge, light emitting diode, electroluminescent, acousto-luminescent, chemical and photo-luminescent, phosphorescent, laser, sunlight and various others disclosed under USPTO Class 362. Illumination and cross-referenced art, and may be employed with their light output conformed to the spiral pattern in the present invention. In addition to the disclosed patterned layout and reflector, accompanying reflector and first optical element design may further enhance the performance for a given application.

In the preferred embodiment as shown in FIG. 1, the reflector 12 is conformed 12A to collect the rays for the rear surface of the light source 10 and redirect the rays 18 to spiral aperture of the first LME 14a. The light source may be a fluorescent tube, robe light, multiple lamps or other known light source technology, having a shape which may be linear or curved including a matching conformation to the spiral aperture of the first LME 14a.

Figure 25:
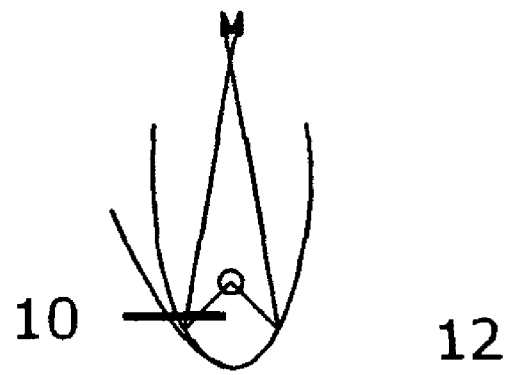
FIG. 25. shows a cross-sectioned of conform optics.
Figure 25:
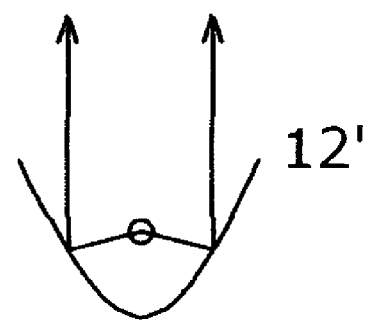
Figure 25:
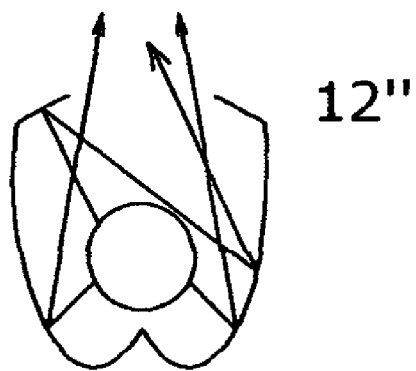

FIG. 25(a) presents a cross-section of an elliptical reflector 12 with the light source positioned at the focal point 10 and the emitted rays 16 diverging at the plane of the first LME 14a.

FIG. 25(b) presents a cross-section of a parabolic reflector 12' with the light source 10 positioned at the focal point and the emitted rays collimated.

FIG. 25(c) presents a split-geometrical reflector 12" with a tubular surface light source including but not limited to a fluorescent, electroluminescent or diode tube 10 reflecting the output beam 18 into a proscribed form.

Figure 26:
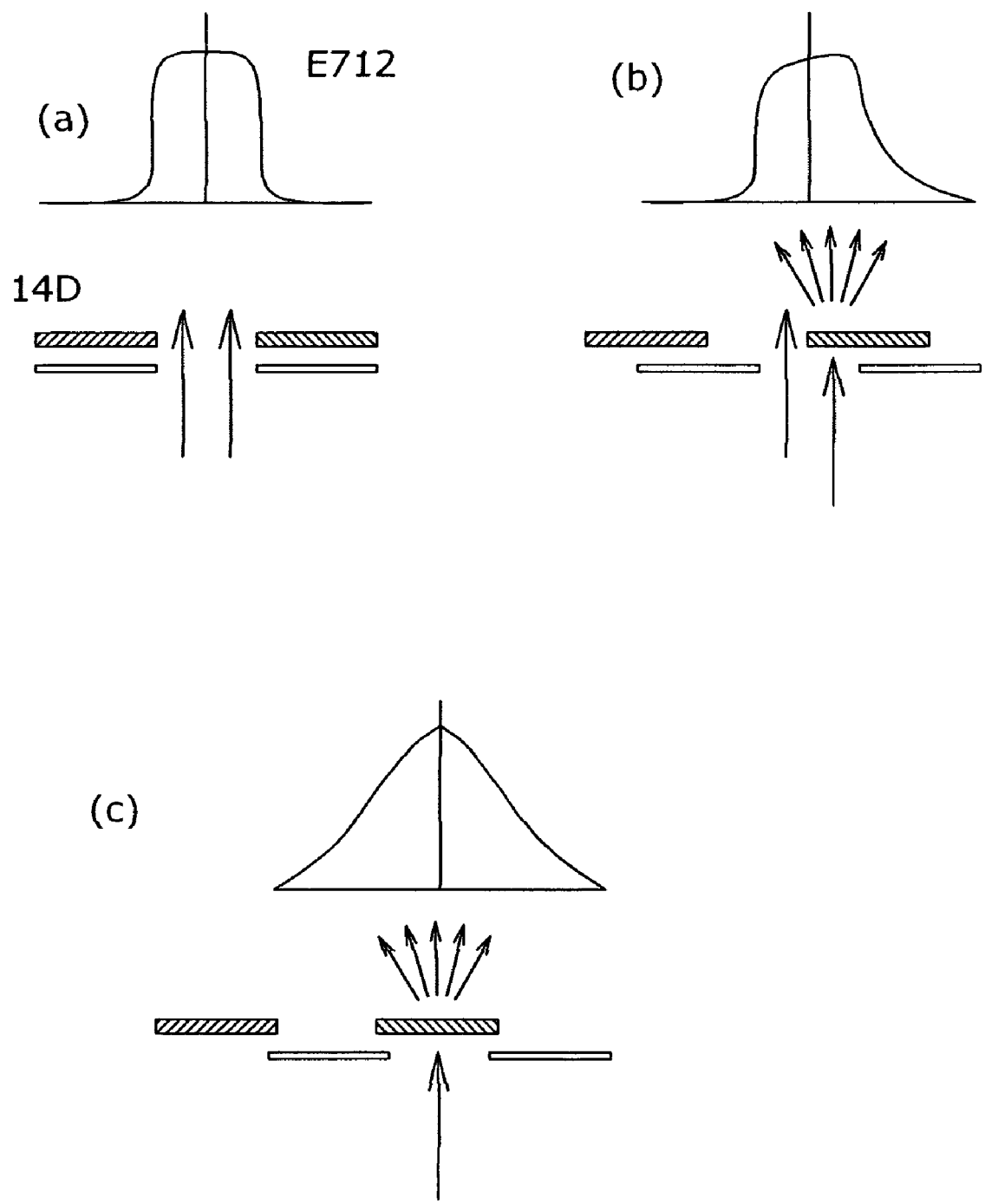
FIG. 26. shows a cross-sectioned of conform optics.

It may be understood that converging, parallel and diverging optics may be employed to optimize the intended application. For example, parallel or collinear optics are not commonly used with projection applications due to the visible effects of the occlusion of the rays at the image plane. Examples of a limited number of the variations of the present invention to different light sources and uses:

Electroluminescent including but not limited to the following conformations:
    as a light source conformed to a reflector design
    with elliptical reflector
    with parabolic reflector
    with aperture recapture optics
    with anamorphic optics
    as a spiral conformed light source
Filament
    as a light source conformed to a reflector design
    with elliptical reflector
    with parabolic reflector
    with aperture recapture optics
    with anamorphic optics
    as a spiral conformed light source
Light Emitting Diode (LED) including but not limited to the following conformations:

as a light source conformed to a reflector design
with elliptical reflector
with parabolic reflector
with aperture recapture optics
with anamorphic optics
with discrete LED having individually designed reflectors
with chip-on-board with reflector, recapture optics
as a spiral conformed light source
Fluorescent Systems including but not limited to the following conformations:
as a light source conformed to a reflector design
with elliptical reflector
with parabolic reflector
with aperture recapture optics
with anamorphic optics
as a spiral conformed light source Optical Elements Detail FIG. 26 presents a cross-section of a preferred embodiment of LME pattern of the optical elements where the LME optical element 14D introduces a diffusion modifier increasingly the full pitch distance causing the output beam to increase in spatial distribution as shown in chart E710 by curve E712 graphing the relationship between beam output intensity and beam output angle from the beam axis. While the optical LME pattern 14D is shown as cross-sectionally discontinuous (permitting an unmodified beam to pass, it may be a continuous pattern with a neutral or other configuration.

Figure 27:
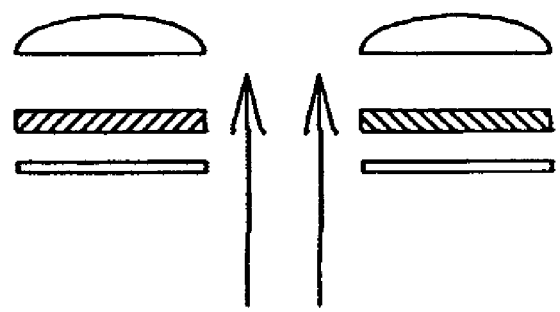
FIG. 27. shows a cross-sectioned of conform optics.
Figure 27:
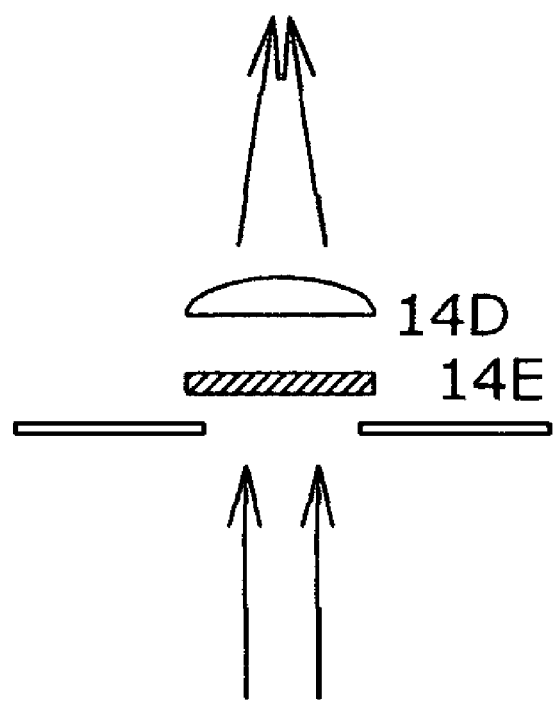

FIG. 27 presents a cross-section of a preferred embodiment of LME pattern having an LME 14D with image focusing characteristics relative to LME 14E having a "gobo" or image pattern. During operation, the LME 14D-E are moved relative to each other to produce a static or dynamic image effect. Additional LME layers may be incorporated.

Figure 28:
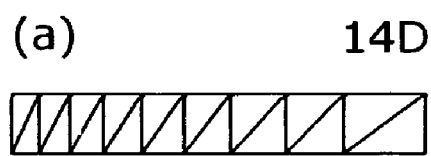
FIG. 28. shows a cross-sectioned of conform optics.
Figure 28:
Figure 28:
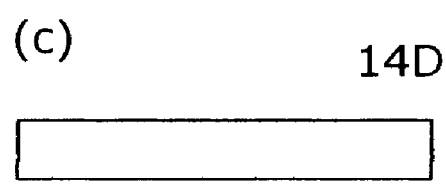
Figure 28:
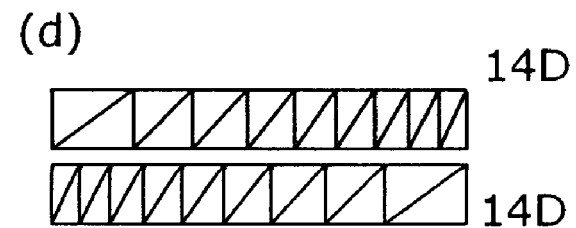

FIG. 28(*a*) presents a cross-section of a preferred embodiment of LME pattern 14D of one of the LME elements where LME optical characteristics is fresnel in construction and varies over the pitch distance, causing a modification of the distribution of the output beam 18.

FIG. 28(*b*) presents a cross-section of a preferred embodiment of LME pattern 14D of one of the LME elements where LME optical characteristics are discrete in construction and varies over the pitch distance, causing a modification of the distribution of the output beam 18.

FIG. 28(*c*) presents a cross-section of a preferred embodiment of LME pattern 14D of one of the LME elements where LME optical characteristics are holographic, holographic optical elements or GRIN (gradient index) in construction and varies over the pitch distance, causing a modification of the distribution of the output beam 18.

FIG. 28(*d*) presents a cross-section of a preferred embodiment of multiple LME patterns 14D, 14Dd' of one of the LME elements where LME optical characteristics are of any type in construction and varies over the pitch distance causing a modification of the distribution of the output beam 18.

Figure 29:
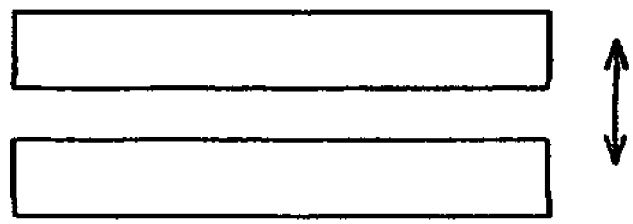
FIG. 29. shows a cross-sectioned of conform optics.
Figure 29:
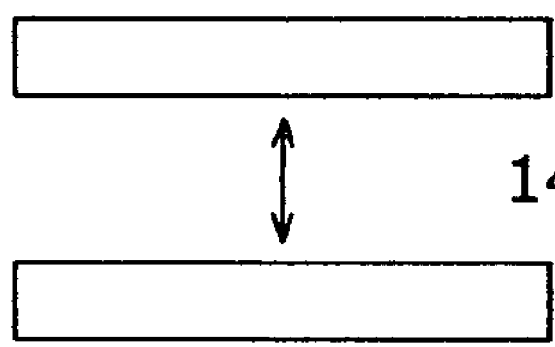

FIG. 29 presents a cross-section of a preferred embodiment of multiple LME patterns 14D, 14Dd' of one of the LME elements where LME optical characteristics are of any type in construction, with a actuator controlling inter-LME distance, and varies over the pitch distance causing a modification of the distribution of the output beam 18.

Figure 30:
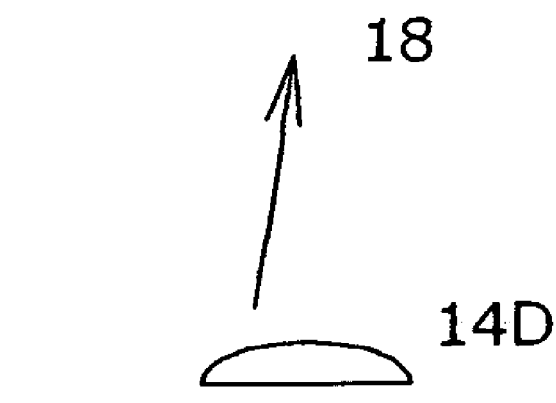
FIG. 30. shows a cross-sectioned of conform optics.
Figure 30:
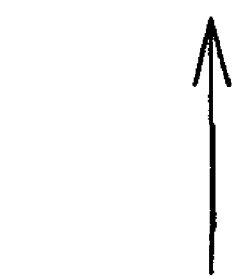
Figure 30:
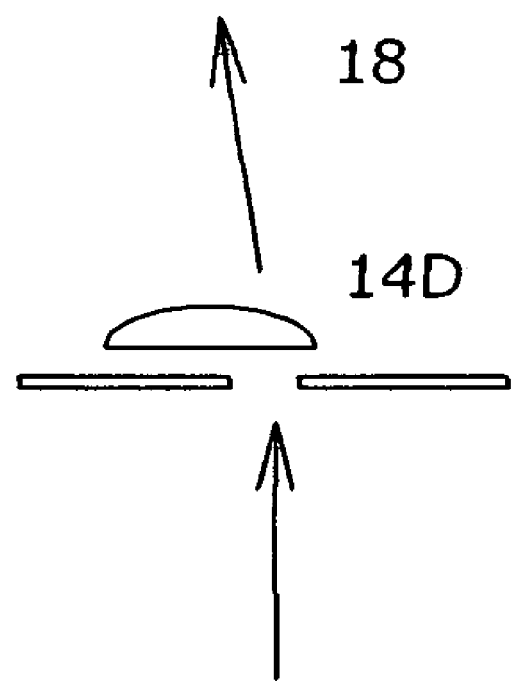

FIG. 30 presents a cross-section of a preferred embodiment of LME pattern 14D of one of the LME elements where LME optical characteristics are a single plano-convex lens in construction with causes as modification of the distribution and direction of the output beam 18, 18' in operation.

Other embodiments may include a cross-section of a preferred embodiment of LME pattern of the optical elements where the first and second LME optical elements varies in separation distance; a cross-section of a preferred embodiment of LME pattern of the optical elements where optical elements introduces a micro-optic diffusive band; a cross-section of a preferred embodiment of LME pattern of the optical elements where optical elements introduces a micro-optic focusing band; a cross-section of a preferred embodiment of LME pattern of the optical elements where optical elements introduces a holographic optical element modifying band.

The divergent angle created by the LME series may be coincident and equal the beam divergence. The ratios may vary within a single LME to approximate the local beam diverge While the optical LME pattern 14D is shown as cross-sectionally discontinuous (permitting an unmodified beam to pass, it may be cross-sectionally continuous pattern with a neutral or other configuration including but not limited to a variation from convergent to direct axial to divergent beam setting.

A second LME pattern may be added to differentially create an elliptically or other projection pattern.

FIG. (E3J not shown) presents a top view of a preferred embodiment of LME pattern 14D of the optical elements of the optical elements where the optical element may varies over both the full pitch distance 14P but varies with angular distance 14R of the spiral causing the output beam to modify at different deflection angles dependent on the LME setting and the distance from the beam axis. Both the angular distance and intra-pitch variations may be constant effects or groups with a specific diameter, discontinuous or continuous.

It may be understood that the principles of a conformal pattern (spiral) and occluding LME optics may be applied innovatively to other patterns such as radial, concentric or linear. In these cases, alternating, counter-directional LME elements may be employed.

Figure 31:
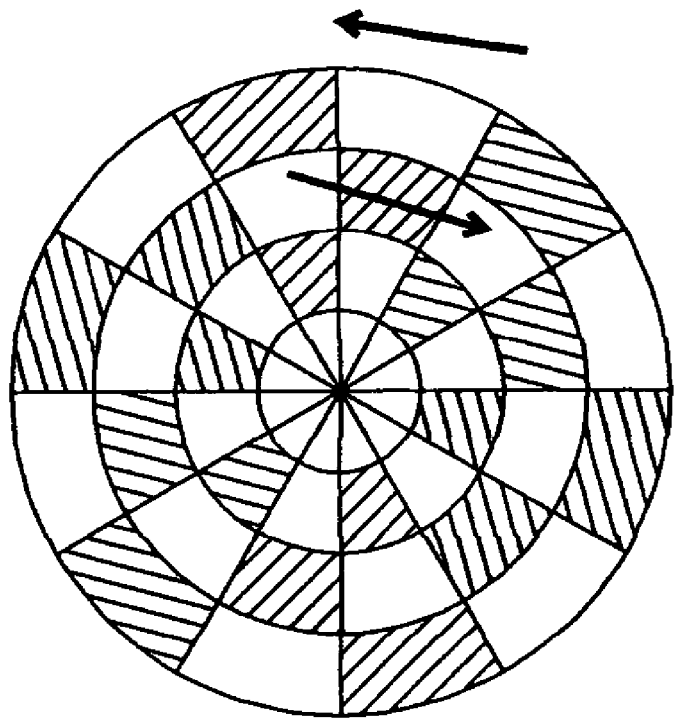
FIG. 31. shows a cross-sectioned of conform optics.
Figure 31:
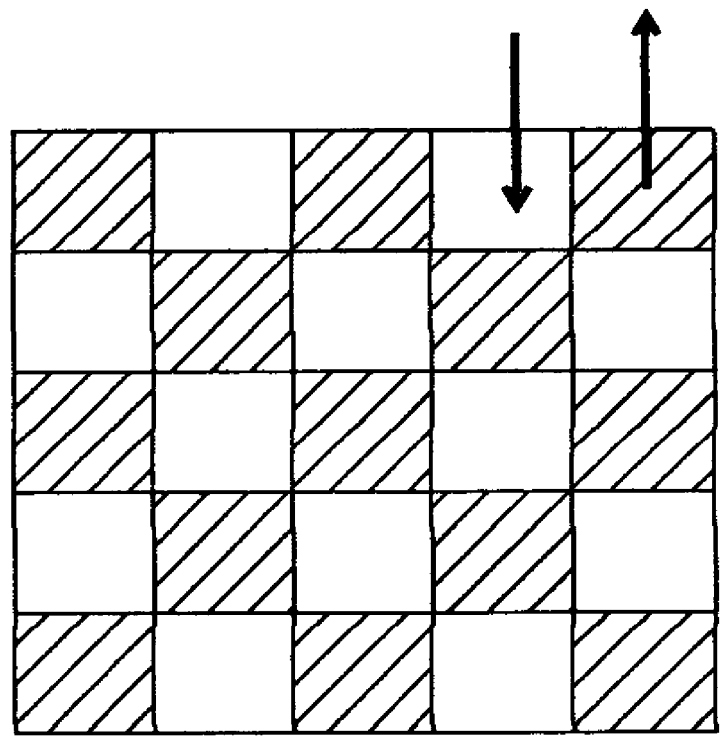

FIG. 31 presents a concentric pattern 600 where the outer LME band 14 rotates clockwise, while the inner LME band 14a rotates counter-clocks, and rectangular pattern 610 has LME subunits 14, 14A which are displaced in opposite directions horizontally and 14', 14A' vertically. In all cases, the asymmetric effect of the gradual introduction of the modifying region of the LME in the beam is locally reduced.

Spaced LMEs

Figure 32:
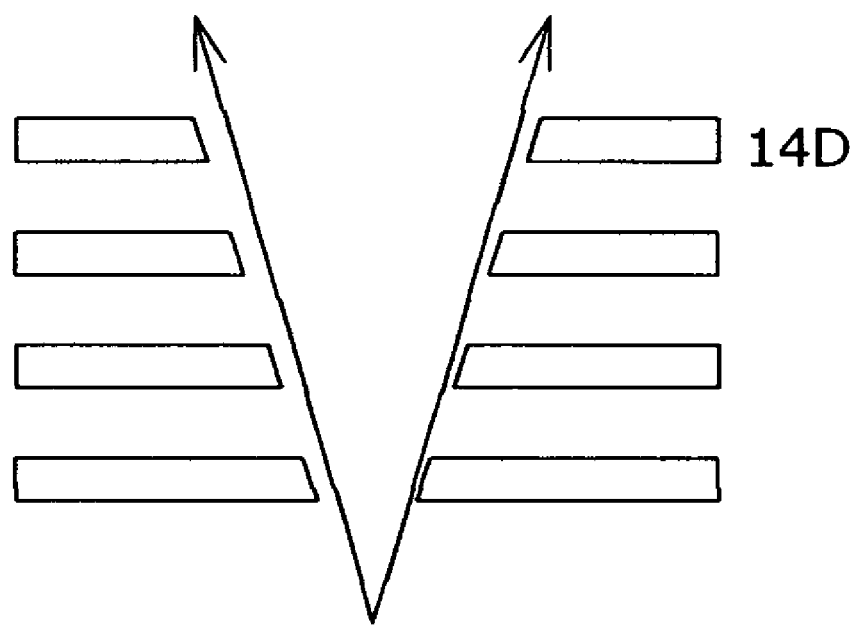
FIG. 32. shows a cross-sectioned of conform optics;
FIG. II-1 presents a perspective view of the principal elements of the present invention.

FIG. 32 presents a cross-section of a preferred embodiment of LME pattern in spaced LMEs for non-collimated beams where the ratio of modifying 14M to transparent 14T area in the first LME 14 is the first of a series and the subsequent LMEs 14A-B are constructed to have subsequent ratios, respectively. FIG. E4 presents 4 LMEs, the mask 14 and 14a-b-c having ratios of 30%-40-50, respectively for a diverging beam.

The divergent angle created by the LME series may be coincident and equal the beam divergence. The ratios may vary within a single LME to approximate the local beam divergence.

The angular rotation required for an equal adjustment may be equalized by adjusting and varying the intensity of the modifying material within a single LME as shown in FIG. 14.

Mixed Light Source

It should be noted that any of the embodiments may employ any number of light sources in any arrangement as module or independent unit or as a common construction with global or individual control. This includes but is not limited to, fluorescent tubes, light emitting diodes, electroluminescent or quantum dots of any type or spectral distribution arranged in the spiral or any other pattern. By controlling the relative output of each of the emitters, individually or commonly group, the full or any partial spectral distribution of light may be achieved.

Certain environments and design will dictate the specific spectral distribution with the common well-known variations being the indoor verses outdoor, north verses south light. Combinations of narrow spectral RGB and broad spectrum white may be cost effective where slight changes in hue as desireable.

Planar Luminaire Embodiment

FIG. II-1 presents a general view of the light fixture having one or more light sources 10, a light modifying optical element ("LME") 14, a housing 200, a support element 202, a fixture orientation adjustment element 204 and a mounting system 206 shown representatively as a conventional articulated yoke but may take any form including and incorporating but not limited to motorized remote control systems, single point ball and socket, flexible conduits, and surface or table-top platforms.

FIGS. II-2A-E presents a top view of the principles of the present invention having a light source 10, and light modifying element ("LME") 14 having a modifying region 62 and a transparent region 64, which may be open, conformed to a spiral pattern which is rotated about a central axis 60 relative to the light source 10. Either the LME 14 or the light source 10 may move relative each other and to the housing 200.

FIG. II-2A presents the light source 10 may be comprised of continuous or series of emitters 10', 10", with or without a diffusive layer. The light source may be conformed into any shape by an integral or affixed optical element (not shown) including but not limited to a point, line, line described by the spiral form, radial line, circle, etc. In the case of an LED, the conforming optical element may be encapsulating material, most often transparent acrylic.

FIG. II-2B presents the light modifying element ("LME") 14 which may continuously or incrementally change, may have a modifying region 16 and a neutral region 18. A multiplicity of spiral forms may be employed including but not limited to constant pitch (spiral of Archimedes), logarithmic (normal intersecting the origin), hyperbolic or other form. Herein, the spiral is shown in the constant pitch form.

FIG. II-2C presents the light source 10 visible through the transparent region 64 of the LME 14.

FIG. II-2D presents the light source 10 partially modified by the modifying LME region 62 of the LME 14 after 90 degree rotation.

FIG. II-2E presents the light source 10 fully modified by the modifying LME region 62 of the LME 14 after 180 degree rotation.

It may be understood that the degree of rotation required for the full transition is dependent on the relative width of the modifying regions 62, 64 and the construction of the spiral. FIGS. 2A-E show a single, constant pitch spiral. A dual spiral reduces the degree of rotation by a factor of 2. Dual, multiple and spirals of other mathematical relationships (logarithmic, etc.) may be employed.

FIG. II-3 presents an cross-sectional view of a section of the spiral conformed light source 10 with a reflector 12 directing the output beam 18 vertically.

FIG. II-3A presents a cross-section of the present invention where the light source 10 is focused and reflected 12 through an optional mask 58 to the LME 14.

FIG. II-3B presents a cross-section of the present invention where the light source 10 is reflected 12 through an optional mask 58 to the LME 14 having different LME characteristics along its chord length or spiral band 14', 14" 14'''.

FIG. II-4A presents a cross-section of the movable LME 14 embodiment of present invention having a rotational actuator 30 which may be but is not limited to a stepper or servo motor, voice coil lever, Nitinol link, etc. and optionally a linear actuator 32 which may be but is not limited to a telescoping support.

FIG. II-4B presents a cross-section of the movable LME 14 embodiment of present invention having a rotational actuator 30 which may be but is not limited to a stepper or servo motor, voice coil lever, Nitinol link, etc. and optionally a linear actuator 34 which may be but is not limited to one or more, non-axial, telescoping supports A triangular array of three linear actuators 34 enables the simultaneous tilting and linear displacement of the LME.

FIG. II-4C presents a cross-section of the movable LME 14 embodiment of present invention having a rotational actuator 30 which may be but is not limited to a stepper or servo motor, voice coil lever, Nitinol link, etc. and optionally, a linear actuator 36 which may be but is not limited to one or more, non-axial, telescoping supports affixed on one end to the light source structure housing 200. A triangular array of three linear actuators 36 enables the simultaneous tilting and linear displacement of the LME. An optional additional axial actuator 36 may be employed.

FIG. II-5 presents a cross-section of a preferred embodiment having a movable LME 14 affixed to a movable exterior housing 200' which has a rear aperture for the external support 202 of the rotational actuator base 30. A waterproof seal 210 may provided between the stationary support base 202 and the movable housing 200'.

FIG. II-6A presents a cross-section of a preferred embodiment having a sealed housing 200 and LME 14 with a movable light source 10 affixed to rotational actuator 30.

FIG. II-6B presents a cross-section of a preferred embodiment having a sealed housing 200 and LME 14 with a movable light source 10 movably attached to linear actuators 34 attached to the rotational actuator 30. This embodiment is advantageous for outdoor, underwater, explosive and other environments. An active cooling element 212 may be provided such as but not limited to a fan, peltier device, thermal grease, etc.

FIG. II-7A presents a cross-section of a preferred embodiment having multiple, movable, interactive LMEs 14, 14' with multiple independent actuators 32.

FIG. II-7B presents a cross-section of a preferred embodiment having multiple, interactive LMEs 14, 14' with multiple independent actuators 32 and a movable light source 10, sealed housing 200 with one affixed LME or neutral window 14'.

Any number of LMEs 14 or light sources 10 may be provided, including partial elements positioned at different radial or axial positions.

The inventions and embodiments presented here in FIGS. 1-7 may applied to non-spiral light fixtures including but not limited to those in my co-pending applications.

Power Recapture

FIG. III-1 shows a general concept of preferred embodiment where IR radiation 102 from the light source of any type, referred to as lamp 100, is transformed directly in electricity by the IR conversion cell 140 (IR-to-Electrical conversion such as but not limited to GaSB photovoltaic cells developed by the Boeing Corporation and thermionic devices developed by Peter Hagelstein of MIT) while visible illumination 104 is transmitted.

FIG. III-2 shows a preferred embodiment where IR radiation 102 is focused by IR lens 122 upon an IR conversion cell 140 while visible illumination 104 is transmitted.

FIG. III-3 shows a preferred embodiment where IR radiation 102 is transmitted through a visible light reflector 120 upon an IR conversion cell 140 while visible illumination is transmitted 102.

These embodiments may be applied to skylights, windows, illumination fixtures which may include but are not limited to light pipes, chemical, electrical and natural light sources, and other transmissive apertures where local power source is not available.

FIG. III-4 shows a preferred embodiment of a luminaire control device 300 where the IR radiation from the lamp is focused upon IR conversion cell which powers a light modifying device such as my copending spiral color changer or optics changer described in U.S. patent documents PPA 60,645,656, 60,683,176 DD 573,680, 576,577 & 580,336, my robotic patent documents PPA 60,584,351, 60,577,531 and other publications, and incorporated herein by reference. The system may include remote communications control described therein, including but not limited to directional or addressed IrDA, WI-FI or communication protocol.

As shown in FIG. III-4, the IR radiation for the lamp 100 is focused by IR reflector 120 onto IR conversion cell 140 which powers the controller circuit 160 including a rechargeable storage battery 180 and recharging electronics, a microprocessor 200, and actuator components 220 for control color, intensity, direction, form, zoom, patterns or other luminaire function or quality.

FIG. III-5 shows the IR radiation from the lamp 100 focused by patterned IR reflector 120 onto IR conversion cells 140 incorporated in the IR plate 240.

It is understood that the configuration of the IR reflectors and lens may be adjusted to the specific luminaire and application and include but are not limited to known optic forms such spherical, aspherical, fresnel, GRIN, micro-optic, micro-reflective prismatic and holographic elements.

Placement of the IR photovoltaics may be central, peripheral, or distributed according the application.

This embodiment may be incorporated in my co-pending or existing robotic, wand and luminaire system, which may included other power means including inductive, visible light, ambient, wind, chemical, or devices.

The embodiments of the present invention particularly disclosed and described herein above are presented merely as an example of the invention. Each embodiment may be used independently. Other embodiments, forms and modifications of the invention coming within the proper scope and spirit of the appended claims will, of course, readily suggest themselves to those skilled in the art

| PARTS NUMBERS | |
|---|---|
| Light Source | 10 |
| Reflector | 12 |
| Reflector Focusing Regions | 12A |
| Light Modifying Elements | 14 a-d |
| First Optical Projection Element | 16 |
| Projected Light | 18 |
| Light Modifying Band | 20 |
| Transparent Region | 22 |
| First Spiral | 24 |

| -continued | |
|---|---|
| PARTS NUMBERS | |
| Second Spiral | 26 |
| First Anamorphic Optical Assembly | 28 |
| Second Anamorphic Optical Assembly | 30 |
| Axial Centering Shaft | 32 |
| LOE Hubs | 34 |
| Incoming Beam | 38 |
| Anamorphic Beam | 36 |
| Aperture/Iris/Slide | 40 |
| First Anamorphic Projection Element | 42 |
| Second Anamorphic Projection Element | 44 |
| First Design Projection Element | 46 |
| Second Design Projection Element | 48 |
| Motor/Actuator | 50 |
| Actuator Shaft/Arm | 52 |
| Actuator Gear/Roller | 54 |
| Circumferential Roller | 56 |
| Optional Mask | 58 |

What I claim is:

1. A light-modifying apparatus for lighting including but not limited to entertainment, and architectural applications, comprising:
    a. A light source means conforming a light beam to a prescribed form where said form is an offset rectangle;
    b. At least one optical modifier means which modifies the qualities of the light beam; and,
    c. At least one actuator means which modifies said optical modifier means in a direction parallel to the long axis of the rectangular form.

2. A light-modifying apparatus in accordance with claim 1, further comprising second actuator means which modifies said optical modifier means in a direction perpendicular to said first actuator.

3. A light-modifying apparatus in accordance with claim 1, further comprising at least one optical modifier means to modify the spectral distribution of the modified beam.

4. A light-modifying apparatus in accordance with claim 1, further comprising at least one optical modifier means to modify the spatial distribution of the modified beam.

5. A light-modifying apparatus in accordance with claim 1, further comprising at least one optical modifier means constructed of refractive optical materials.

6. A light-modifying apparatus in accordance with claim 1, further comprising at least one optical modifier means constructed of holographic optical materials.

7. A light-modifying apparatus in accordance with claim 1, further comprising a light source conforming means having a reflective surface which reflects said beam in a direction away from the principal exit aperture and subsequently redirects the light through the conforming optics.

8. A light-modifying apparatus for lighting including but not limited to entertainment, and architectural applications, comprising:
    a. A light source means conforming a light beam to a prescribed form where said form is a regular, constant pitch spiral about a principal optical axis having a conformed area of less than 50% of the source aperture;
    b. At least one optical modifier means having an initial and active modifier regions which modifies the qualities of the light beam; and
    c. At least one actuator means which modifies said optical modifier means rotationally about the principal optical axis.

9. A light-modifying apparatus in accordance with claim 8, further comprising at least one optical modifier means to modify the spectral distribution of the modified beam.

10. A light-modifying apparatus in accordance with claim 8, further comprising at least one optical modifier means to modify the spatial distribution of the modified beam.

11. A light-modifying apparatus in accordance with claim 8, further comprising a light source conforming means having a reflective surface which reflects said beam in a direction away from the principal exit aperture and subsequently redirects the light through the conforming optics.

* * * * *